(12) United States Patent  
Arai et al.

(10) Patent No.: US 8,148,259 B2
(45) Date of Patent: Apr. 3, 2012

(54) METHOD FOR MANUFACTURING SEMICONDUCTOR DEVICE

(75) Inventors: Yasuyuki Arai, Kanagawa (JP);
Koichiro Tanaka, Kanagawa (JP);
Yukie Suzuki, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 874 days.

(21) Appl. No.: 11/843,745

(22) Filed: Aug. 23, 2007

(65) Prior Publication Data

US 2008/0057632 A1 Mar. 6, 2008

(30) Foreign Application Priority Data

Aug. 30, 2006 (JP) ................................. 2006-233232

(51) Int. Cl.
*H01L 21/4763* (2006.01)
(52) U.S. Cl. ......................... 438/637; 438/622; 438/638
(58) Field of Classification Search .................. 438/622, 438/637, 638
See application file for complete search history.

(56) References Cited

U.S. PATENT DOCUMENTS

| | | | |
|---|---|---|---|
| 4,594,471 A | 6/1986 | Yamazaki | |
| 4,603,470 A | 8/1986 | Yamazaki | |
| 4,752,455 A | 6/1988 | Mayer | |
| 4,861,964 A | 8/1989 | Sinohara | |
| 4,865,686 A | 9/1989 | Sinohara | |
| 4,895,735 A | 1/1990 | Cook | |
| 4,970,196 A | 11/1990 | Kim et al. | |
| 4,987,006 A | 1/1991 | Williams et al. | |
| 5,035,202 A | 7/1991 | Nishikawa et al. | |
| RE33,947 E | 6/1992 | Shinohara | |
| 5,171,650 A | 12/1992 | Ellis et al. | |
| 5,173,441 A | 12/1992 | Yu et al. | |
| 5,292,559 A | 3/1994 | Joyce, Jr. et al. | |
| 5,292,686 A | 3/1994 | Riley et al. | |
| 5,313,043 A | 5/1994 | Yamagishi | |
| 5,373,627 A | 12/1994 | Grebe | |
| 5,453,134 A * | 9/1995 | Arai et al. | ...................... 136/244 |
| 5,480,097 A | 1/1996 | Carter, Jr. et al. | |

(Continued)

FOREIGN PATENT DOCUMENTS

CN 1035102 A 8/1989

(Continued)

OTHER PUBLICATIONS

Office Action re Chinese application No. CN 200710147138.4, dated Jul. 26, 2010 (with English translation).

*Primary Examiner* — James Mitchell
(74) *Attorney, Agent, or Firm* — Husch Blackwell LLP

(57) ABSTRACT

The present invention offers a method for forming an opening portion by a simple process without using a photomask or a resist. Further, the present invention proposes a method for manufacturing a semiconductor device at low cost. A plurality of light absorbing layers is formed over a substrate, an interlayer insulating layer is formed over the plurality of light absorbing layers, the plurality of light absorbing layers is irradiated with a linear or rectangular laser beam from the interlayer insulating layer side, and at least the interlayer insulating layer which is over the plurality of light absorbing layers is removed and an opening portion is formed; and accordingly, a plurality of opening portions can be formed by removing the plurality of light absorbing layers and an insulating film formed over the plurality of light absorbing layers.

9 Claims, 24 Drawing Sheets

U.S. PATENT DOCUMENTS

| | | | |
|---|---|---|---|
| 5,501,938 A | 3/1996 | Ellis et al. | |
| 5,567,336 A | 10/1996 | Tatah | |
| 5,683,601 A | 11/1997 | Tatah | |
| 5,708,252 A | 1/1998 | Shinohara et al. | |
| 5,712,206 A * | 1/1998 | Chen | 438/601 |
| 5,935,462 A | 8/1999 | Tatah | |
| 5,958,268 A | 9/1999 | Engelsberg et al. | |
| 6,048,588 A | 4/2000 | Engelsberg | |
| 6,149,988 A | 11/2000 | Shinohara et al. | |
| 6,159,832 A | 12/2000 | Mayer | |
| 6,177,151 B1 | 1/2001 | Chrisey et al. | |
| 6,261,856 B1 | 7/2001 | Shinohara et al. | |
| 6,335,151 B1 | 1/2002 | Ausschnitt et al. | |
| 6,396,147 B1 | 5/2002 | Adachi et al. | |
| 6,521,971 B2 * | 2/2003 | Tsai | 257/529 |
| 6,600,534 B1 | 7/2003 | Tanaka et al. | |
| 6,667,535 B2 * | 12/2003 | Yang | 257/529 |
| 6,690,081 B2 * | 2/2004 | Bakir et al. | 257/522 |
| 6,726,517 B2 | 4/2004 | Yamada et al. | |
| 6,762,124 B2 | 7/2004 | Kian et al. | |
| 6,878,608 B2 * | 4/2005 | Brofman et al. | 438/459 |
| 6,887,804 B2 * | 5/2005 | Sun et al. | 438/130 |
| 6,962,837 B2 | 11/2005 | Yamazaki | |
| 6,964,887 B2 | 11/2005 | Akagawa | |
| 7,062,849 B2 | 6/2006 | Ohashi et al. | |
| 7,176,069 B2 | 2/2007 | Yamazaki et al. | |
| 7,199,516 B2 | 4/2007 | Seo et al. | |
| 7,202,155 B2 | 4/2007 | Fukuchi | |
| 7,226,819 B2 | 6/2007 | Maekawa et al. | |
| 7,354,798 B2 * | 4/2008 | Pogge et al. | 438/109 |
| 7,542,301 B1 | 6/2009 | Liong et al. | |
| 7,732,334 B2 * | 6/2010 | Morisue et al. | 438/694 |
| 2002/0056838 A1 | 5/2002 | Ogawa | |
| 2002/0089628 A1 | 7/2002 | Jang et al. | |
| 2002/0127844 A1 * | 9/2002 | Grill et al. | 438/622 |
| 2002/0158337 A1 * | 10/2002 | Babich et al. | 257/758 |
| 2003/0048399 A1 | 3/2003 | Okumura | |
| 2003/0063210 A1 * | 4/2003 | Tsuboi | 348/340 |
| 2004/0012071 A1 * | 1/2004 | Ido et al. | 257/529 |
| 2004/0048415 A1 | 3/2004 | Horie | |
| 2004/0262768 A1 * | 12/2004 | Cho et al. | 257/758 |
| 2005/0043186 A1 | 2/2005 | Maekawa et al. | |
| 2005/0185382 A1 | 8/2005 | Ooi et al. | |
| 2005/0275049 A1 | 12/2005 | Kirby et al. | |
| 2006/0017153 A1 * | 1/2006 | Choi | 257/700 |
| 2006/0046336 A1 | 3/2006 | Shoji et al. | |
| 2006/0049156 A1 | 3/2006 | Mulloy et al. | |
| 2006/0099747 A1 | 5/2006 | Park | |
| 2006/0158482 A1 | 7/2006 | Nakamura et al. | |
| 2006/0163743 A1 | 7/2006 | Kuwabara et al. | |
| 2006/0214156 A1 | 9/2006 | Pan et al. | |
| 2006/0223242 A1 * | 10/2006 | Daubenspeck et al. | 438/132 |
| 2006/0258122 A1 * | 11/2006 | Whitefield et al. | 438/467 |
| 2006/0270175 A1 | 11/2006 | Aoki et al. | |
| 2007/0007515 A1 | 1/2007 | Suh et al. | |
| 2007/0023860 A1 * | 2/2007 | Kim et al. | 257/529 |
| 2007/0051952 A1 | 3/2007 | Yamazaki et al. | |
| 2007/0085938 A1 | 4/2007 | Yamazaki et al. | |
| 2007/0117280 A1 | 5/2007 | Lee et al. | |
| 2008/0026543 A1 | 1/2008 | Miyairi et al. | |
| 2008/0042288 A1 | 2/2008 | Yamazaki et al. | |
| 2008/0044744 A1 | 2/2008 | Yamazaki et al. | |
| 2008/0050851 A1 | 2/2008 | Tanaka et al. | |
| 2008/0057618 A1 | 3/2008 | Honda et al. | |
| 2008/0057718 A1 | 3/2008 | Omata et al. | |
| 2008/0099877 A1 * | 5/2008 | Daubenspeck et al. | 257/529 |
| 2008/0182349 A1 | 7/2008 | Yamazaki et al. | |
| 2008/0227232 A1 | 9/2008 | Yamazaki et al. | |
| 2009/0152743 A1 | 6/2009 | Jomaa et al. | |

FOREIGN PATENT DOCUMENTS

| | | |
|---|---|---|
| EP | 0 322 258 A2 | 6/1989 |
| JP | 63-84789 | 4/1988 |
| JP | 2-317 | 1/1990 |
| JP | 2000-133636 | 5/2000 |
| JP | 2000-252609 | 9/2000 |
| JP | 2002-164591 | 6/2002 |
| JP | 2004-286466 | 10/2004 |

* cited by examiner

FIG. 3A
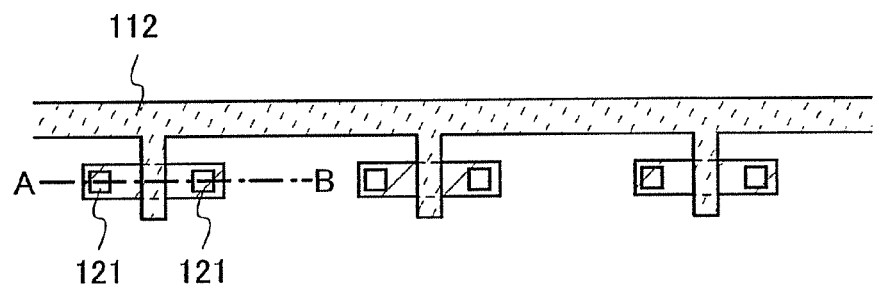
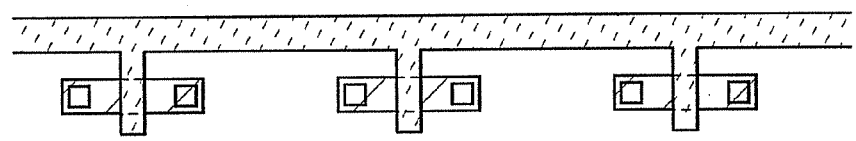
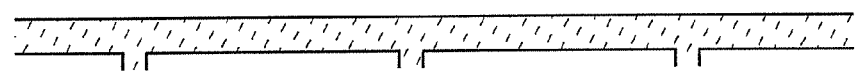
FIG. 3B
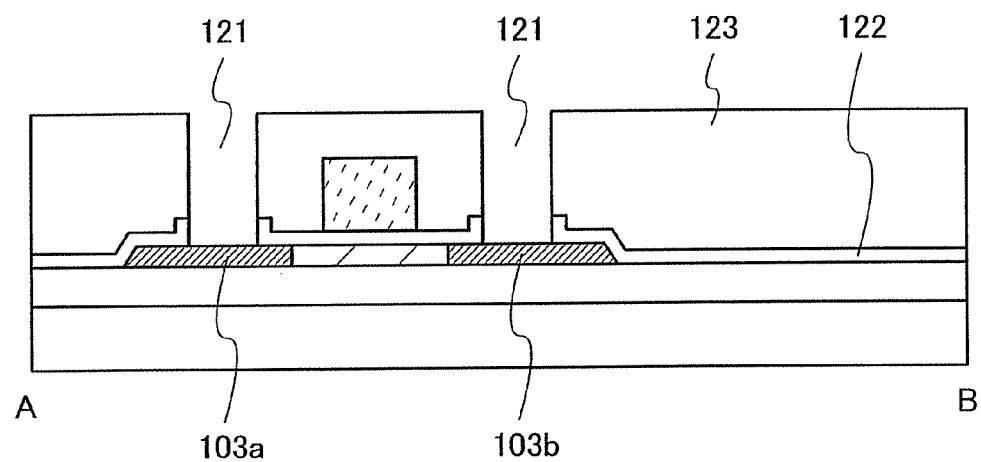

FIG. 7A
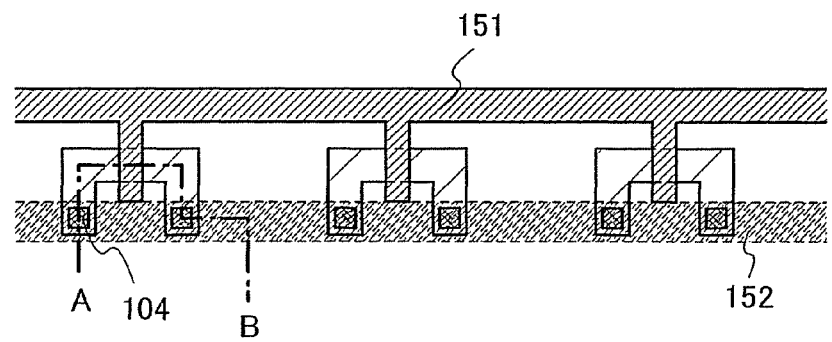
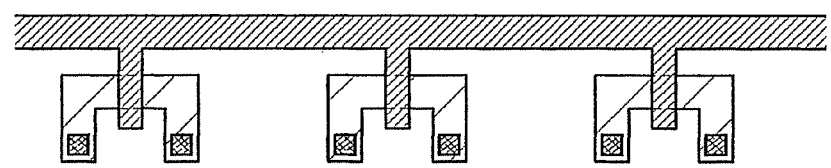
FIG. 7B
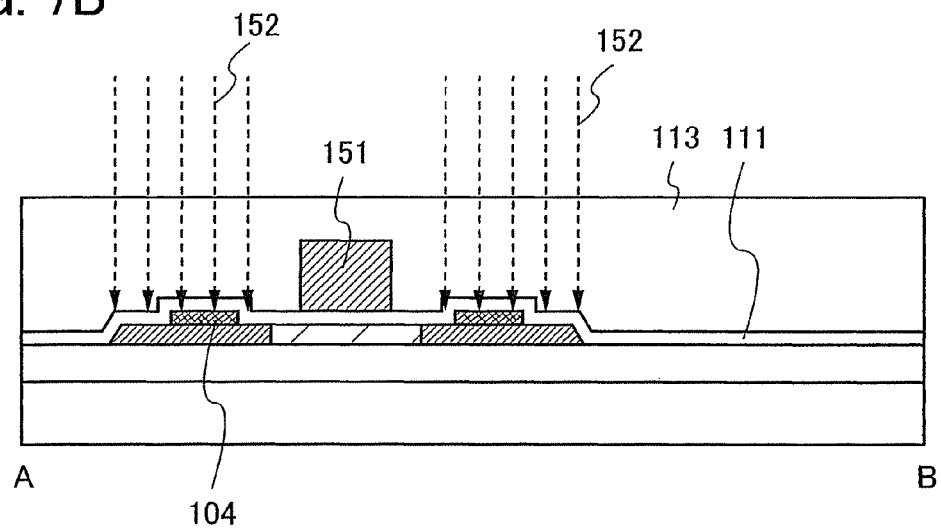

FIG. 8A
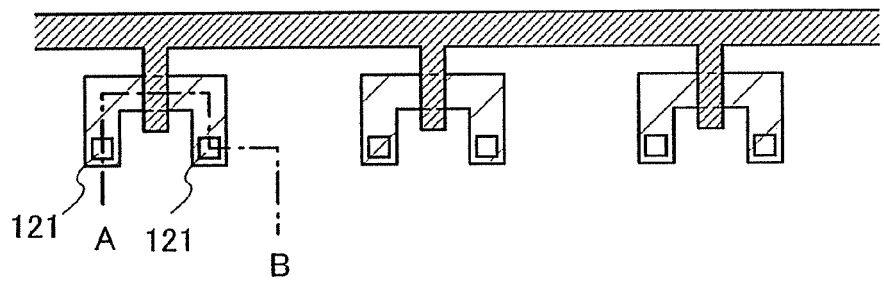
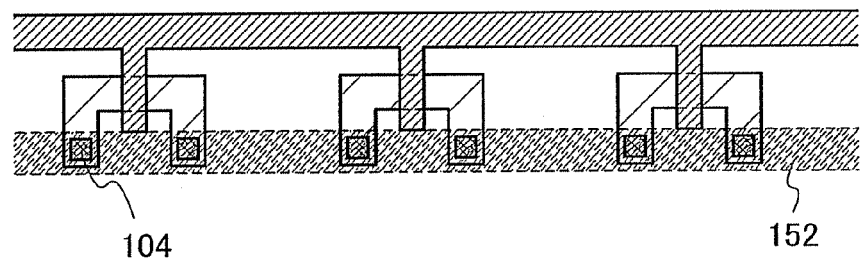
FIG. 8B
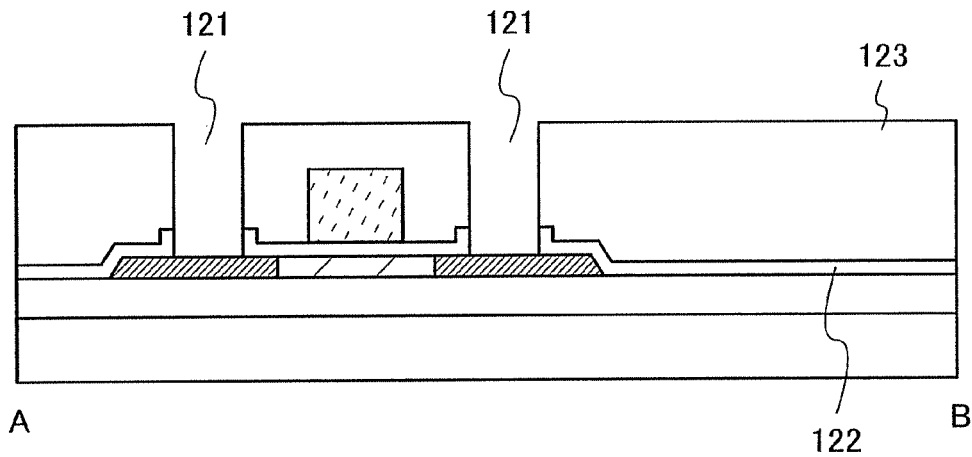

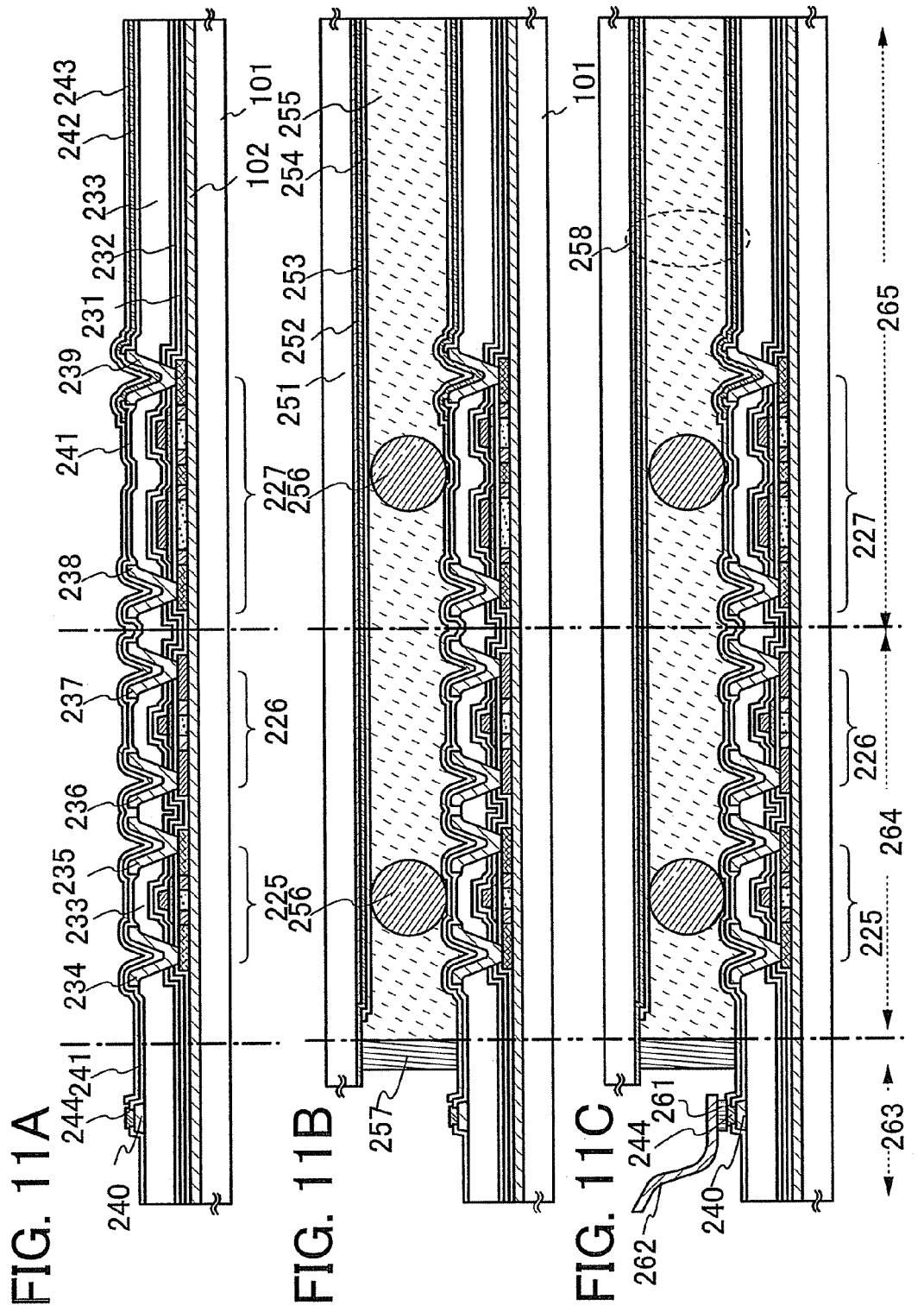

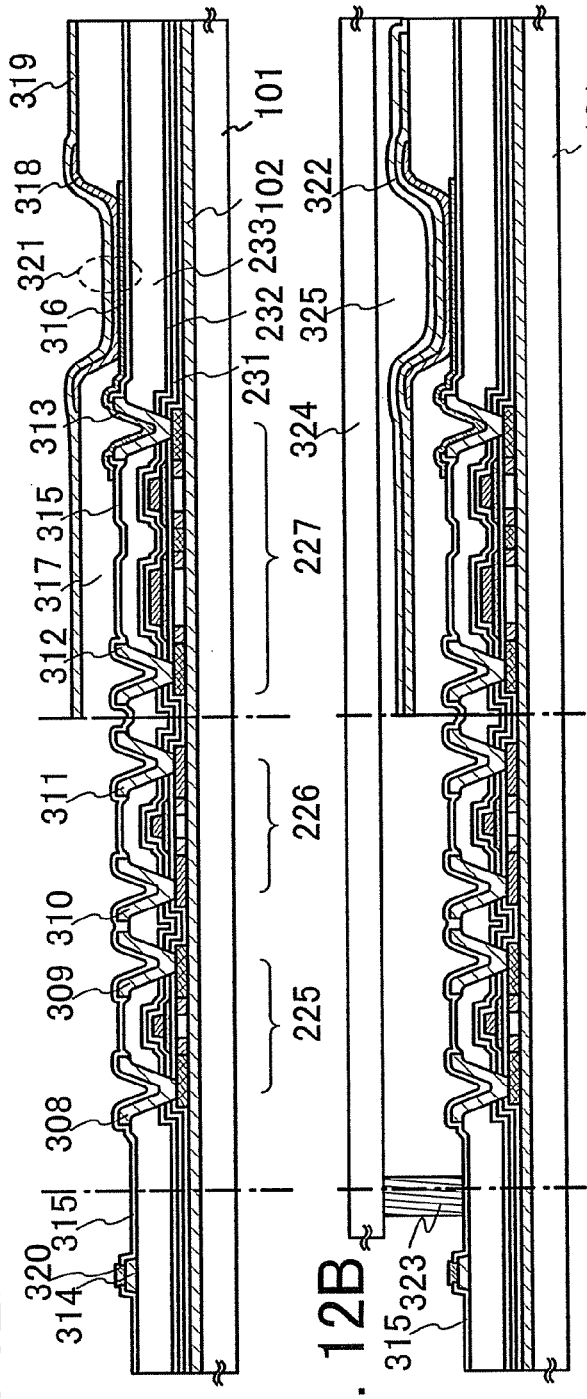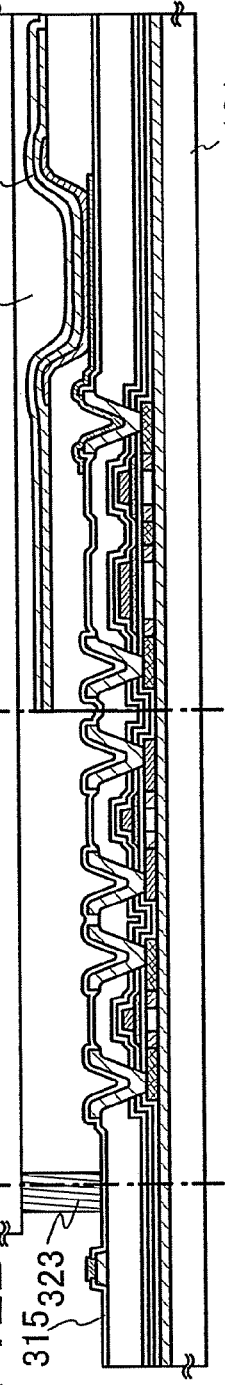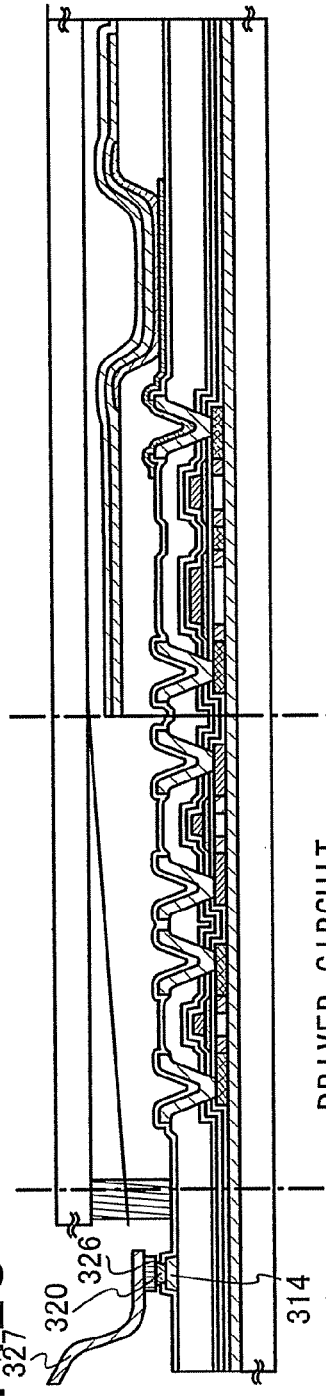

METHOD FOR MANUFACTURING SEMICONDUCTOR DEVICE

BACKGROUND OF THE INVENTION

1. Field of the Invention

The present invention relates to a method for manufacturing a semiconductor device including a semiconductor element having an opening portion.

2. Description of the Related Art

Conventionally, so-called active matrix driving type display panels or semiconductor integrated circuits which have a semiconductor element typified by a thin film transistor (hereinafter also referred to as a "TFT") or a MOS (Metal Oxide Semiconductor) transistor are manufactured by forming a resist mask formed by a light-exposure step (hereinafter referred to as a photolithography step) which uses a photomask, and selectively etching various thin films, whereby opening portions are formed.

In a photolithography step, a resist mask is formed by applying a resist to an entire surface of a substrate, prebaking it, irradiating the resist with ultraviolet rays or the like through a photomask and exposing the resist, and then developing it. Subsequently, a layer (a layer formed using a semiconductor material, an insulating material, or a conductive material, particularly, a layer formed using an insulating material) which is present in a portion which is later to be an opening portion is etched and removed using the resist mask as a mask, whereby the opening portion is formed.

A thin film processing method, by which opening is formed by irradiating a light-transmitting conductive film with a linear beam using a laser beam having a wavelength of less than or equal to 400 μm, is mentioned in Patent Document 1 (Japanese Published Patent Application No. S63-84789) and Patent Document 2 (Japanese Published Patent Application No. H2-317) by the present applicant.

SUMMARY OF THE INVENTION

However, photomasks used in photolithography techniques have a detailed shape, and a high degree of precision is required for their shape; therefore, they are extremely expensive.

In a case where a design of a semiconductor device is changed, naturally the need to newly prepare a photomask to match an opening portion which is changed arises. As described above, since a photomask is a shaped object which is formed with a detailed shape to a high degree of precision, it takes considerable time to manufacture. That is, if the replacement of a photomask which accompanies a change in design or an imperfection in design, results in not only a monetary burden but also the risk of time delay.

Further, since a resist and a developing solution for a resist are used in a step of forming an opening portion in a photolithography step, there is a problem in that a large amount of a chemical solution and water are required and it is necessary to dispose of a large amount of a waste solution.

Accordingly, the present invention offers a method for forming an opening portion by a simple process without using a photomask or a resist. Further, the present invention proposes a method for manufacturing a semiconductor device at low cost.

One aspect of the present invention is a method for manufacturing a semiconductor device disclosed in the present invention, including the steps of forming a plurality of light absorbing layers over a substrate, forming an interlayer insulating layer over the plurality of light absorbing layers, irradiating the plurality of light absorbing layers with a linear or rectangular laser beam from the interlayer insulating layer side, and forming an opening portion by removing at least the interlayer insulating layer which is over the plurality of light absorbing layers.

The laser beam, with which the plurality of light absorbing layers is irradiated, is made to have a linear or rectangular shape, the light absorbing layer is formed only in a region in which an opening portion is formed, and part excluding the region is formed as a layer having a light-transmitting property. By irradiating the plurality of light absorbing layers and the layer having a light-transmitting property in the periphery thereof with a linear or rectangular laser beam, the interlayer insulating layer over the plurality of light absorbing layers can be selectively removed, and an opening portion can be formed.

Further, the plurality of light absorbing layers is formed such that they are arranged in a given direction, a conductive layer having a light-transmitting property is formed in a direction intersecting with the given direction, and the plurality of light absorbing layers arranged in the given direction is irradiated with a linear or rectangular laser beam. Thus, an opening portion can be formed in the interlayer insulating layer which is over the plurality of light absorbing layers without forming an opening portion in the part of the interlayer insulating layer which is over the conductive layers.

As a typical example of the opening portion, there is an opening portion which is formed in an insulating layer formed over a semiconductor layer such as a source region or drain region, which is an impurity region, so that a first conductive layer and a second conductive layer formed over the semiconductor layer with the insulating layer interposed therebetween are connected to the source region or drain region. In addition, there is an opening portion, which is formed in an insulating layer formed over a first conductive layer or a second conductive layer, for connection of the first conductive layer or the second conductive layer with the insulating layer interposed therebetween.

The present invention is not limited to the description above, and can be implemented as appropriate on an opening portion of a transistor or the like used for a memory device of an LSI (Large Scale Integrated Circuit), an integrated circuit (IC) of/such as a logic circuit, an RFID (Radio frequency identification) tag, as well as on a semiconductor device (a display device such as a liquid crystal display device, a light-emitting display device, or an electrophoretic display device) which uses a thin film transistor.

In the present invention, the above-described display device refers to a device using a display element, that is, an image display device. Included in the category of the display device are a module in which a connector such as an FPC (Flexible printed circuit), a TAB (Tape Automated Bonding) tape, or a TCP (Tape Carrier Package) is attached to a display panel; a module in which a printed wiring board is provided at the end of a TAB tape or a TCP; or a module in which an IC (integrated circuit) or a CPU is directly mounted on a display element by a COG (Chip On Glass) method.

According to the present invention, by selectively irradiating with a linear or rectangular laser beam a region in which a plurality of light absorbing layers is formed, the plurality of light absorbing layers and an insulating layer formed over the plurality of light absorbing layers can be removed, and a plurality of opening portions can be formed.

Further, a plurality of opening portions can be formed in the following manner: a plurality of light absorbing layers is formed so as to be arranged in a first direction, a conductive layer having a light-transmitting property is formed in a direction intersecting with the first direction, and an insulating layer is formed over the plurality of light absorbing layers and the conductive layer having a light-transmitting property; and then, the light absorbing layer and the insulating layer formed over the light absorbing layer are removed by selectively irradiating the plurality of light absorbing layers arranged in the first direction with a linear laser beam. That is, an opening portion can be formed at a given position over the substrate by forming an entire region in which the opening portion is not formed using a material having a light-transmitting property and selectively irradiating with a linear laser beam a region in which a light absorbing layer is formed.

By irradiating the plurality of light absorbing layers with a laser beam such as a linear laser beam or a rectangular laser beam, the plurality of light absorbing layers can be irradiated with a laser beam at one time, and accordingly, semiconductor devices can be manufactured with high mass productivity.

Thus, an opening portion can be formed without using a resist or a photomask, which are required in a conventional photolithography technique. Since a photomask is not used, time loss due to replacement of photomasks can be reduced, and accordingly, the limited production of diversified products is possible. Further, since a resist and a developing solution for the resist are not used, a large amount of a chemical solution and water are not required. Therefore, the process can be greatly simplified and cost can be reduced compared with a process of forming an opening portion using a conventional photolithography technique.

By using the present invention, a process of contact opening in a semiconductor device can be performed by a simple process. Further, a method for manufacturing a semiconductor device can be provided at low cost.

BRIEF DESCRIPTION OF THE DRAWINGS

In the accompanying drawings:

FIGS. 3A and 3B are a top view and a cross-sectional view, respectively, each illustrating a method for manufacturing a semiconductor device of the present invention;

FIGS. 7A and 7B are a top view and a cross-sectional view, respectively, each illustrating a method for manufacturing a semiconductor device of the present invention;

FIGS. 8A and 8B are a top view and a cross-sectional view, respectively, each illustrating a method for manufacturing a semiconductor device of the present invention;

FIGS. 11A to 11C are cross-sectional views illustrating a method for manufacturing a semiconductor device of the present invention;

FIGS. 12A to 12C are cross-sectional views illustrating a method for manufacturing a semiconductor device of the present invention;

DETAILED DESCRIPTION OF THE INVENTION

Figure 1A:
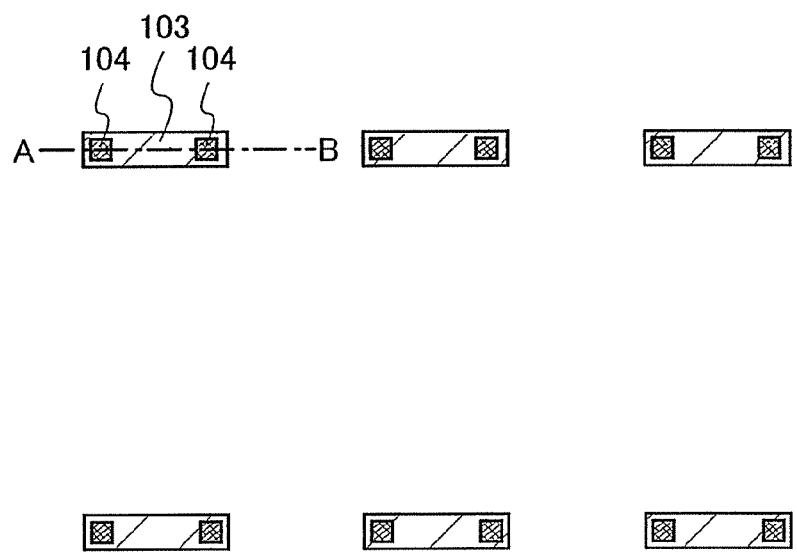
FIGS. 1A and 1B are a top view and a cross-sectional view, respectively, each illustrating a method for manufacturing a semiconductor device of the present invention.

Embodiment Modes of the present invention will be explained below with reference to the accompanied drawings. However, the present invention is not limited to explanation to be given below, and it is to be easily understood that various changes and modifications in modes and details thereof will be apparent to those skilled in the art without departing from the purpose and the scope of the present invention. Therefore, the present invention should not be interpreted as being limited to the description of the embodiment modes to be given below. It is to be noted that the same portions are denoted by the same reference numerals in each drawing and detailed descriptions thereof are omitted.

Embodiment Mode 1

In this embodiment mode, a LAP (Laser Ablation Process), in which an opening portion is formed by laser beam irradiation without undergoing a photolithography step, is shown hereinafter. FIGS. 1A to 5B are top views and cross-sectional views showing a step of forming an opening portion in an insulating layer formed over a substrate, in a pixel portion in which pixels each including a display element are arranged in matrix. FIGS. 1B, 2B, 3B, 4B, and 5B show cross-sectional views taken along lines A-B of FIGS. 1A, 2A, 3A, 4A, and 5A, respectively.

In this embodiment mode, description is made with reference to a mode in which a top-gate thin film transistor is used as a thin film transistor that is part of a display element and an opening portion is formed in an insulating layer formed over a semiconductor layer of the thin film transistor. However, the present invention is not limited to this and is appropriately applicable to a mode in which an opening portion is formed in an insulating layer formed over an inverted staggered thin film transistor or a mode in which an opening portion is formed in an insulating layer formed over a first wiring.

In this embodiment mode, description is made with reference to a mode in which a plurality of light absorbing layers in a direction intersecting with a gate wiring is irradiated with a linear laser beam in a pixel portion in which pixels each including a display element are arranged in matrix.

Figure 1B:
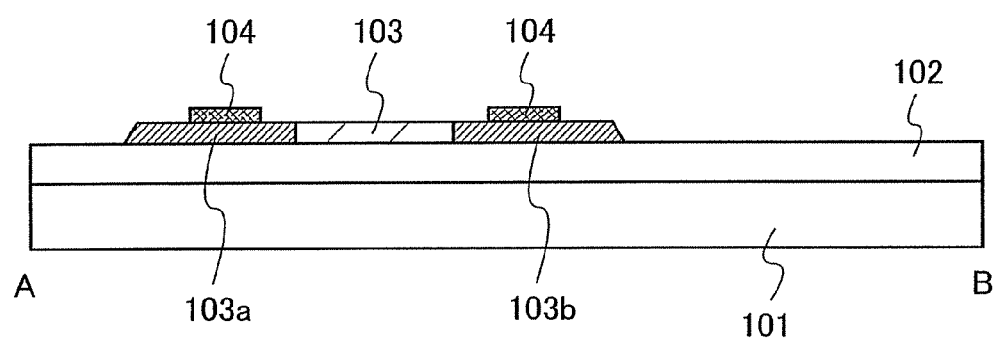

As shown in FIGS. 1A and 1B, a first layer 102 functioning as a base film is formed in one side of a substrate 101, a second layer 103 is formed over the first layer 102, and light absorbing layers 104 are formed over the second layer 103.

As the substrate 101, a glass substrate, a plastic substrate, a metal substrate, a ceramic substrate, or the like can be appropriately used. Alternatively, a printed wiring board or an FPC can be used. In a case where the substrate 101 is a glass substrate or a plastic substrate, a large-size substrate having a size of, for example, 320 mm×400 mm, 370 mm×470 mm, 550 mm×650 mm, 600 mm×720 mm, 680 mm×880 mm, 1000 mm×1200 mm, 1100 mm×1250 mm, or 1150 mm×1300 mm can be used. Here, a glass substrate is used as the substrate 101.

Although the first layer 102 functioning as a base film is not necessarily indispensable, it is preferable to provide the first layer 102 to have a function of preventing the substrate 101 from being etched when a layer which is to be formed over the first layer 102 is etched later. Further, in a case where a glass substrate is used as the substrate 101, it is preferable to provide the first layer 102 to prevent an impurity such as an alkali metal element contained in the glass substrate from moving toward a semiconductor layer. The first layer 102 may be formed by appropriately using a suitable material, and typically, silicon oxide, silicon nitride, silicon oxynitride, aluminum nitride, and the like are given.

The first layer 102 is formed using a sputtering method, an LPCVD method, a plasma CVD method, an evaporation method, a coating method, or the like. Here, the first layer 102 is formed by stacking a silicon nitride oxide layer and a silicon oxynitride layer by a plasma CVD method.

An electrode, a pixel electrode, a wiring, an antenna, a semiconductor layer, an insulating layer, and the like can be appropriately formed using the second layer 103. The second layer 103 can be formed using a conductive material, an insulating material, or a semiconductor material appropriately in accordance with a portion to be formed such as an electrode, a pixel electrode, a wiring, an antenna, a semiconductor layer, an insulating layer, and the like.

The second layer 103 is preferably formed using a material which does not absorb a laser beam 114 with which the second layer 103 is irradiated later. Consequently, the second layer 103 is not affected even when the light absorbing layer 104 is irradiated with the laser beam 114 later.

The second layer 103 is formed using a sputtering method, an LPCVD method, a plasma CVD method, an evaporation method, a coating method, a droplet discharging method, an electrolytic plating method, an electroless plating method, or the like.

In this embodiment mode, a semiconductor layer is formed as the second layer 103. The semiconductor layer is formed using silicon, germanium, or the like. Further, a film with any of states selected from an amorphous semiconductor, a semi-amorphous semiconductor (also referred to as SAS) in which an amorphous state and a crystalline state are mixed, a microcrystalline semiconductor in which a crystal grain with a grain size of 0.5 to 20 nm can be observed, and a crystalline semiconductor film. An acceptor element or a donor element such as phosphorus, arsenic, or boron may be contained in regions, which are to be a source region and a drain region later. Here, a crystalline semiconductor layer etched in a predetermined shape is formed as the semiconductor layer. Further, impurity regions 103a and 103b containing phosphorus may be formed in the semiconductor layer.

The light absorbing layer 104 is formed using a material which absorbs the laser beam 114 with which the light absorbing layer 104 is irradiated later. As a material which absorbs the laser beam 114, a material having band gap energy smaller than energy of the laser beam 114 is used. Further, the light absorbing layer 104 is preferably formed using a material having a boiling point or a sublimation point each of which is lower than a melting point of the second layer 103. By using such a material, without melting the second layer 103, the laser beam 114 can be absorbed and part of a layer having a light-transmitting property in contact with the light absorbing layer 104 can be removed using energy of the laser beam 114.

The light absorbing layer 104 can be formed appropriately using a conductive material, a semiconductor material, or an insulating material. As the conductive material, an element selected from titanium (Ti), aluminum (Al), tantalum (Ta), tungsten (W), molybdenum (Mo), copper (Cu), chromium (Cr), neodymium (Nd), iron (Fe), nickel (Ni), cobalt (Co), ruthenium (Ru), rhodium (Rh), palladium (Pd), osmium (Os), iridium (Ir), silver (Ag), gold (Au), platinum (Pt), cadmium (Cd), zinc (Zn), silicon (Si), germanium (Ge), zirconium (Zr), or barium (Ba) can be used. Further, the light absorbing layer 104 can be formed to have a single layer or a stack of an alloy material, a nitride compound, and the like containing the element as its main component. Furthermore, a conductive material having a light-transmitting property such as indium oxide containing tungsten oxide, indium zinc oxide containing tungsten oxide, indium oxide containing titanium oxide, indium tin oxide containing titanium oxide, indium tin oxide (ITO), indium zinc oxide, or indium tin oxide to which silicon oxide is added, can also be used.

As an insulating material, a single layer of an oxygen compound, a carbon compound, or a halogen compound of the above-described element can be used. Further, a stack of these can be used. Typically, zinc oxide, aluminum nitride, zinc sulfide, silicon nitride, silicon oxide, mercury sulfide, aluminum chloride, and the like are given. Further, an insulating film in which particles capable of absorbing light are dispersed, typically, a silicon oxide film in which silicon microcrystals are dispersed can be used. Furthermore, an insulating layer in which pigment is dissolved or dispersed in an insulator can be used.

As a semiconductor material, silicon, germanium, or the like can be used. Further, a film with any of states selected from an amorphous semiconductor, a semiamorphous semi-conductor (also referred to as SAS) in which an amorphous state and a crystalline state are mixed, a microcrystalline semiconductor in which a crystal grain with a grain size of 0.5 to 20 nm can be observed in an amorphous semiconductor, or a crystalline semiconductor film. Furthermore, an acceptor element or a donor element such as phosphorus, arsenic, or boron may be contained.

Further, the light absorbing layer 104 is preferably formed using a material which can absorb the laser beam 114 with which the light absorbing layer 104 is irradiated later, and physically dissociate part of the light absorbing layer 104 or part of a layer in contact with the light absorbing layer 104 due to emission of gas in the light absorbing layer 104, sublimation of the light absorbing layer 104, or the like caused by energy of the laser beam 114. By using such a material, the light absorbing layer 104 can be easily removed.

As the light absorbing layer capable of emitting gas in the light absorbing layer 104 by energy of the laser beam 114, a layer formed using a material containing at least one of hydrogen and a rare gas element is given. Typically, a semiconductor layer containing hydrogen, a conductive layer containing rare gas or hydrogen, an insulating layer containing rare gas or hydrogen, and the like are given. In this case, part of the light absorbing layer 104 is physically dissociated concurrently with emission of gas in the light absorbing layer 104, and accordingly, the light absorbing layer 104 can be easily removed.

The light absorbing layer which can be sublimated by energy of the laser beam 114 is preferably formed using a material having a low sublimation point of approximately 100 to 2000° C. Alternatively, a material having a boiling point of 1000 to 2700° C. and heat conductivity of 0.1 to 100 W/mK can be used. As the light absorbing layer which can be sublimated, a material having a low sublimation point of approximately 100 to 2000° C. can be used. As a typical example thereof, aluminum nitride, zinc oxide, zinc sulfide, silicon nitride, mercury sulfide, aluminum chloride, and the like are given. As a material having a boiling point of 1000 to 2700° C. and heat conductivity of 0.1 to 100 W/mK, germanium (Ge), silicon oxide, chromium (Cr), titanium (Ti), and the like are given.

The light absorbing layer 104 can be selectively formed by an electrolytic plating method, an electroless plating method, a droplet discharging method, or the like. Alternatively, the light absorbing layer 104 can be formed by selective etching after formation of a film by a coating method, a sputtering method, or a CVD method.

Here, as the light absorbing layer 104, a chromium layer with a thickness of 10 to 100 nm, preferably 20 to 50 nm is formed.

Figure 2A:
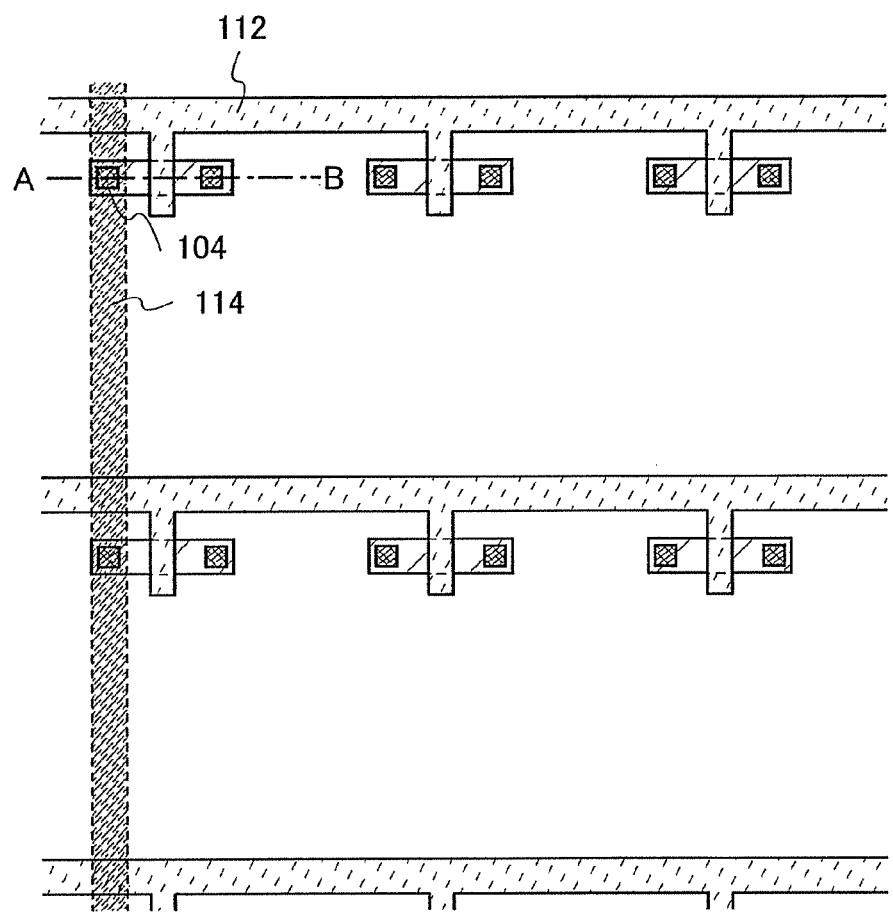
FIGS. 2A and 2B are a top view and a cross-sectional view, respectively, each illustrating a method for manufacturing a semiconductor device of the present invention.
Figure 2B:
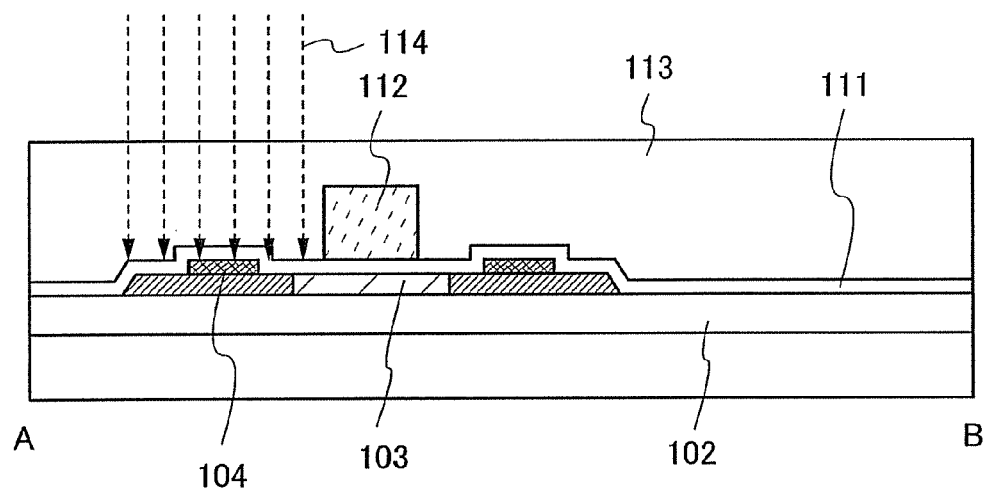

Next, as shown in FIG. 2B, a layer having a light-transmitting property is formed over the first layer 102, the second layer 103, and the light absorbing layer 104. The layer having a light-transmitting property can be formed to have a single layer or a stack.

The layer having a light-transmitting property can be formed by appropriately selecting a material capable of transmitting the laser beam 114 with which the light absorbing layer 104 is irradiated later. As the material which transmits the laser beam 114, a material having band gap energy larger than energy of the laser beam is used.

As the layer having a light-transmitting property, here, a gate insulating layer 111, a gate wiring 112, and an interlayer insulating layer 113 are sequentially formed.

The gate insulating layer 111 is formed to have a single layer structure or a stacked structure of silicon nitride, silicon nitride containing oxygen, silicon oxide, silicon oxide containing nitrogen, or the like. Here, silicon oxynitride with a thickness of 50 to 200 nm is formed by a plasma CVD method.

In this embodiment mode, as shown in FIG. 2A, part of the gate wiring 112 is also irradiated with a laser beam when the light absorbing layer 104 is irradiated with the laser beam later. Therefore, the gate wiring 112 is preferably formed using a conductive layer having a light-transmitting property.

As the conductive layer having a light-transmitting property, a material having band gap energy larger than energy of the laser beam with which the conductive layer having a light-transmitting property is irradiated later is used. Here, as the conductive layer having a light-transmitting property, ITO with a thickness of 50 to 200 nm, preferably, 100 to 150 nm, formed by a sputtering method is used.

In irradiation of the light absorbing layer 104 with a laser beam later, in a region which is not irradiated with the laser beam, a conductive layer which absorbs light may be formed as an auxiliary wiring to be in contact with the gate wiring. In particular, the auxiliary wiring is preferably formed using a conductive layer having low resistivity. As the conductive layer having low resistivity, typically, a metal layer containing platinum, palladium, nickel, gold, aluminum, copper, silver, tantalum, tungsten, molybdenum, or titanium can be used.

The interlayer insulating layer 113 can be formed using an organic resin film such as polyimide, polyamide, BCB (benzocyclobutene), acrylic, or siloxane (a substance having a skelton structure formed by the bond of silicon and oxygen, in which at least one kind of fluorine, aliphatic hydrocarbon, and aromatic hydrocarbon is combined with silicon), an inorganic interlayer insulating film (an insulating film containing silicon, such as silicon nitride or silicon oxide), a low-k (low dielectric) material, or the like, each of which is applied by an SOG (Spin On Glass) method or a spin coating method. Since the interlayer insulating layer 113 is formed with a main purpose for relieving and planarizing unevenness due to TFTs formed over the glass substrate, a film superior in planarity is preferable. Here, a polyimide layer with a thickness of 300 to 1000 nm is formed by a coating method.

Then, the light absorbing layer 104 is irradiated with the laser beam 114. As the laser beam 114, a laser beam which transmits the interlayer insulating layer 113 and has energy absorbed by the light absorbing layer 104 is appropriately selected. Typically, a laser beam in an ultraviolet region, a visible region, or an infrared region is appropriately selected for laser beam irradiation.

As a typical example of a laser oscillator which emits the laser beam 114, in a case of ultraviolet light, harmonics of an excimer laser such as a $F_2$ laser; and a YAG laser, a YLF laser, a $YAlO_3$ laser, a $GdVO_4$ laser, a $Y_2O_3$ laser, a $PbWO_4$ laser, a $YVO_4$ laser, and the like, which are solid-state lasers; are given. In a case of visible light, harmonics and the like of an Ar laser, a Kr laser, and the above-described solid-state lasers are given. In a case of infrared light, fundamental waves of the above-described solid-state lasers; a semiconductor laser using GaN, GaAs, GaAlAs, InGaAsP, or the like; a $CO_2$ laser, a glass laser; a Ti: sapphire laser; a pigment laser; an alexandrite laser; and the like are given. Here, a fundamental wave of a YAG laser is used for irradiation.

A continuous wave laser beam or a pulsed laser beam can be appropriately applied to the laser beam 114. Though a pulsed laser having a frequency band from several tens to several hundreds of Hz is generally used, a laser beam oscillated from a pulsed laser having a repetition rate of 10 MHz or more, which is extremely higher than the frequency band; a frequency of a pulse width in the range of picoseconds; or a frequency thereof in the range of femtoseconds (10-15 seconds) may be used. In particular, a laser beam, which is oscillated with a pulse width of 1 femtosecond to 10 picoseconds and emitted from a pulsed laser has high intensity. Thus, a non-linear optical effect (multiphoton absorption) is caused, and a layer formed using a material having a light-transmitting property, the band gap energy of which is higher than the energy of the laser beam, can also be removed by the energy of the laser beam.

It is preferable that a pulsed laser be used in order to prevent a semiconductor layer, a glass substrate, or the like from being damaged due to absorption of laser light which is more than necessary. It is more preferable that a picosecond laser or a femtosecond laser each having an extremely narrow pulse width is used.

A laser irradiation apparatus has an optical system in which a laser beam emitted from a laser oscillator is formed to have a linear shape. As such an optical system, a cylindrical lens, a slit, a mask, or the like are used.

As the optical system for making the laser beam linear, an electro-optical element can be used. The electro-optical element serves as a light shutter or a light reflector and serves as a variable mask by input of an electronic signal based on CAD data to design a semiconductor device. When an electronic signal input to the electro-optical element, which is to be a light shutter, is changed by a control device, an area and a position of a laser beam can be changed. That is, an area and a position of a thin film to be processed can be selectively changed.

As the electro-optical element, an element which can adjust an area through which light is transmitted selectively, for example, an element having a liquid crystal material or an electrochromic material, and in addition, an element which can adjust light reflection selectively, for example, a digital micromirror device (also referred to as a DMD) are given. A DMD, which is a kind of a spatial light modulator, is a device in which a plurality of small-sized mirrors called micromirrors which rotate around a fixed axis due to an electrostatic effect or the like is arranged in matrix on a semiconductor substrate such as Si. As other electro-optical elements, a PLZT element can be used, which is an optical element modulating transmitted light according to an electro-optical effect. A PLZT element is a device, which is formed using oxide ceramics containing lead, lanthanum, zircon, and titanium, referred to as PLZT derived from an initial character of a symbol of each element. The PLZT element is formed using transparent ceramics and can transmit light. The direction of polarized light of light can be changed by applying voltage, and a light shutter is formed by combining the PLZT element and a polarizer. It is to be noted that a device which can withstand transmission of a laser beam is used for the electro-optical element.

The spot of the laser beam, with which an irradiated surface is irradiated, preferably has a linear shape or a rectangular shape. In a case where a large-size substrate is used, a long side of the spot of the laser beam is preferable made to be 20 to 100 cm in order to shorten the processing time. Alternatively, a plurality of laser oscillators and a plurality of optical systems may be provided and a large-size substrate may be processed in a short time. Specifically, a plurality of electro-optical elements may be provided above a substrate stage, and irradiation with respective laser beams from laser oscillators corresponding to respective electro-optical elements may be performed, and a processing area for one substrate may be divided.

A laser beam irradiation apparatus which performs irradiation with a laser beam preferably has a substrate stage to which a substrate is located, a control device, and a position aligning means, in addition to a laser oscillator.

Alignment of an irradiation position can be performed with high precision by providing an imaging element such as a CCD (Charge Coupled Device) camera and performing laser irradiation based on data obtained from the imaging element.

A control device performs scanning of a laser beam one-dimensionally or two-dimensionally with respect to a region irradiated with a laser beam over an irradiated surface, whereby a large area of the substrate can be irradiated. By the control device, scanning of a laser beam is preferably performed in conjunction with controlling of a moving means which moves the substrate stage two-dimensionally. Further, by the control device, scanning of a laser beam and controlling of a moving means are preferably performed in conjunction with controlling of the laser oscillator. Furthermore, by the control device, scanning of a laser beam, controlling of the moving means, and controlling of the laser oscillator are preferably performed in conjunction with a position aligning mechanism which recognizes a positional marker.

Here, scanning is performed using a moving means which two-dimensionally moves the substrate stage which holds the substrate.

The light absorbing layer 104 is selectively irradiated with the laser beam 114 using the above-described electro-optical element. The laser beam 114 can be set to have energy density in the range which is sufficient for emission of gas in the light absorbing layer 104, sublimation of the light absorbing layer, and the like, typically, in the range of 1 $\mu J/cm^2$ to 100 $J/cm^2$. The laser beam 114 having sufficiently high energy density is absorbed by the light absorbing layer 104. At this time, the light absorbing layer 104 is locally and rapidly heated by the energy of the absorbed laser beam to be sublimated. Due to volume expansion accompanied with the sublimation, the light absorbing layer 104 is dissociated physically and scattered. Through the above, the interlayer insulating layer over the light absorbing layer 104 can be removed, and as shown in FIGS. 3A and 3B, an opening portion 121 can be formed. Here, as the laser beam 114, a second harmonics of a YAG laser is used.

In a case where dust is generated by laser beam irradiation, it is preferable that a blowing means which is used for preventing the dust from being attached to a surface of the substrate to be processed or a vacuuming means of the dust is further provided for the laser beam irradiation apparatus. By blowing or vacuuming the dust concurrently with laser beam irradiation, the dust can be prevented from being attached to the surface of the substrate.

The irradiation with the laser beam 114 can be performed under atmospheric pressure or reduced pressure. In a case where the irradiation with the laser beam 114 is performed under reduced pressure, a scattering matter generated in removing the light absorbing layer 104 is easily collected, and accordingly, remaining of the scattering matter over the substrate can be suppressed.

Further, the light absorbing layer 104 may be irradiated with the laser beam with the substrate 101 heated. Also in this case, the light absorbing layer 104 is easily removed.

In this embodiment mode, a plurality of light absorbing layers 104, which is formed in a direction intersecting with the gate wiring 112, is irradiated with a linear laser beam 114. Typically, the laser beam irradiation is performed in a direction intersecting with the gate wiring 112 at 90 degrees. In this embodiment mode, the gate wiring 112 is formed using a conductive layer having a light-transmitting property; therefore, by irradiation with the laser beam 114 in the direction intersecting with the gate wiring 112 at 90 degrees, a plurality of light absorbing layers 104 and a layer having a light-transmitting property formed thereover the plurality of light absorbing layers 104 can be removed and an opening portion can be formed over the second layer 103. At this time, an interlayer insulating layer 123 having an opening portion and a gate insulating layer 122 having an opening portion are formed.

In FIGS. 2A and 2B, irradiation with the laser beam 114 is performed in the direction intersecting with the gate wiring 112 at 90 degrees; however, the laser beam irradiation may be performed parallel to the gate wiring 112. In this case, the second layer 103 is preferably formed using a material which does not absorb a laser beam. Thus, since the gate wiring 112 and the second layer 103 each have a light-transmitting property, the plurality of light absorbing layers 104 and part of the layer having a light-transmitting property are removed so that an opening portion can be formed over the second layer 103.

This embodiment mode shows a mode in which a plurality of light absorbing layers and the layer having a light-transmitting property in contact with the light absorbing layer are scattered by irradiating the plurality of light absorbing layers 104 with the linear laser beam 114, whereby an opening portion is formed.

Further, there is also another case where, by irradiating the plurality of light absorbing layers 104 with the linear laser beam 114, an upper layer portion of the light absorbing layer and the layer having a light-transmitting property are scattered and a lower layer portion of the light absorbing layer remains over the second layer 103. In such a case, a third layer, which is to be formed later, may be formed with the remaining light absorbing layer remaining. Alternatively, the third layer, which is to be formed later, may be formed after the remaining light absorbing layer is removed by dry etching or wet etching.

Furthermore, there is also another case where, by irradiation with the laser beam 114, only the layer having a light-transmitting property in contact with the light absorbing layer 104 is removed. In such a case, a third layer, which is to be formed later, may be formed with the remaining light absorbing layer remaining. Alternatively, the third layer, which is to be formed later, may be formed after the remaining light absorbing layer is removed by dry etching or wet etching.

Figure 4A:
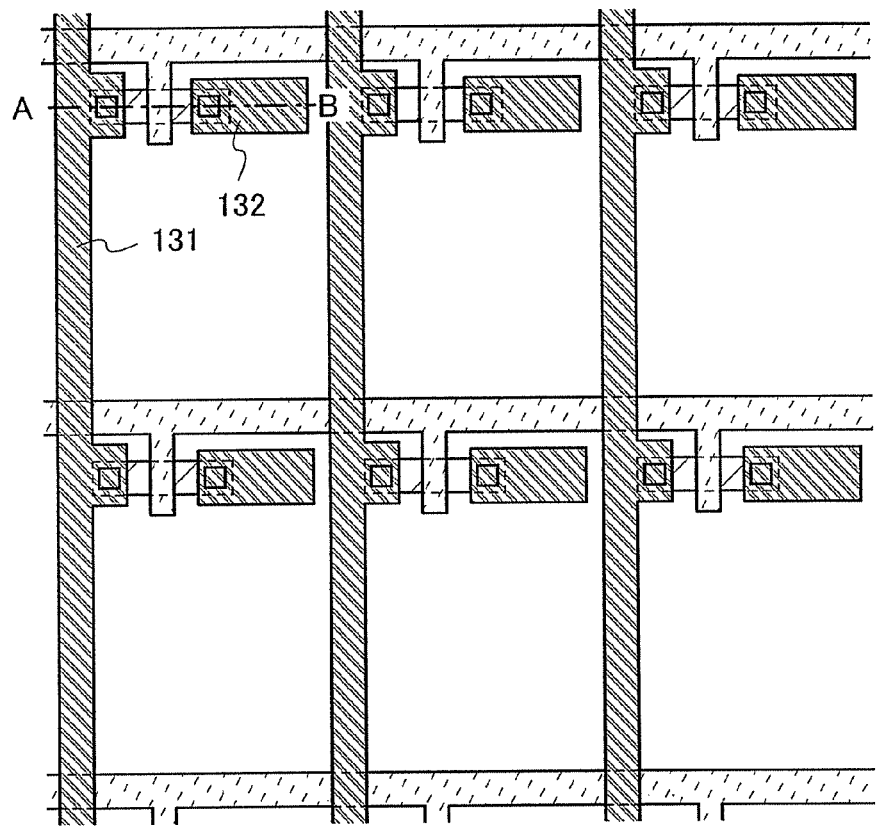
FIGS. 4A and 4B are a top view and a cross-sectional view, respectively, each illustrating a method for manufacturing a semiconductor device of the present invention.
Figure 4B:
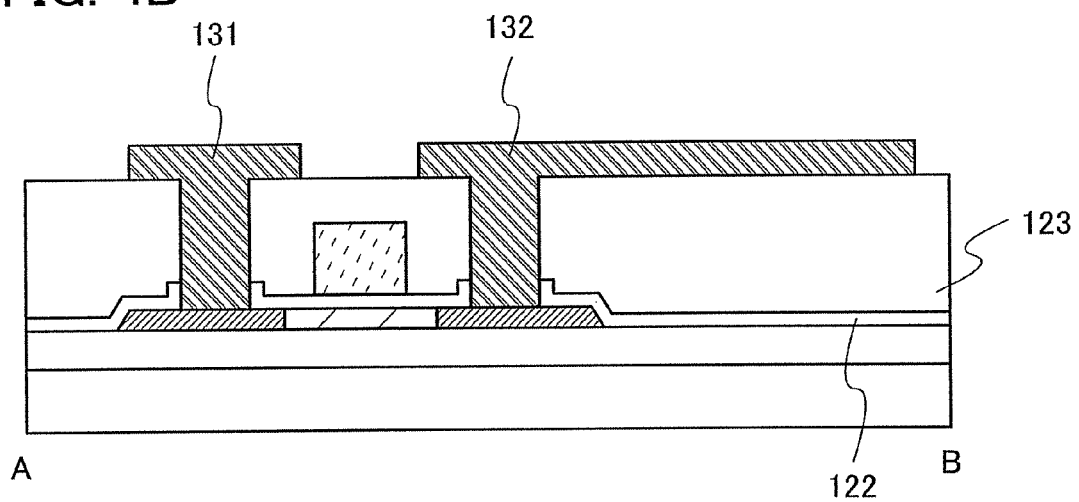

Then, as shown in FIGS. 4A and 4B, the third layer is formed in the opening portion. An insulating layer, a semiconductor layer, and a conductive layer can be appropriately formed using the third layer. Here, as the third layer, a source wiring 131 and a drain electrode 132 are formed.

The source wiring 131 and the drain electrode 132 are formed using an element selected from aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), or silicon (Si), or an alloy material or a compound material containing the element as its main component to have a single layer or a stack by a CVD method, a sputtering method, or the like. Here, a titanium layer, an aluminum layer, and a titanium layer are successively formed by a sputtering method.

Through the above steps, the opening portion can be formed in the interlayer insulating layer 113. Further, a thin film transistor and a wiring connected to the thin film transistor can be formed.

Figure 5A:
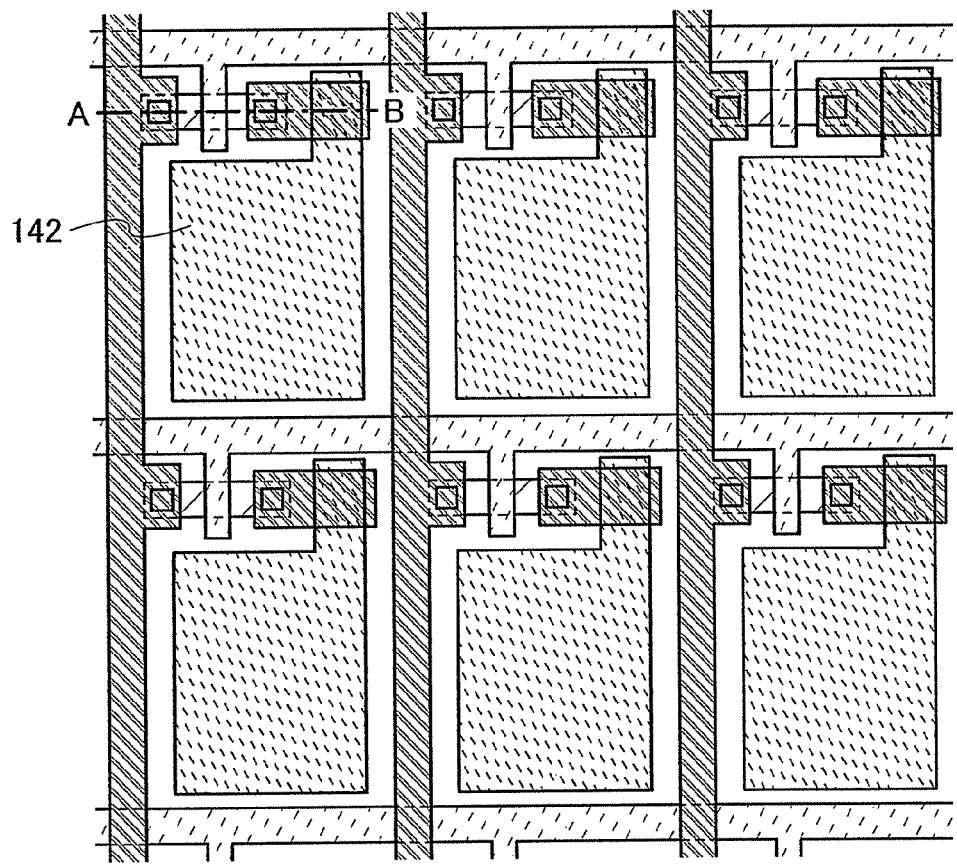
FIGS. 5A and 5B are a top view and a cross-sectional view, respectively, each illustrating a method for manufacturing a semiconductor device of the present invention.
Figure 5B:
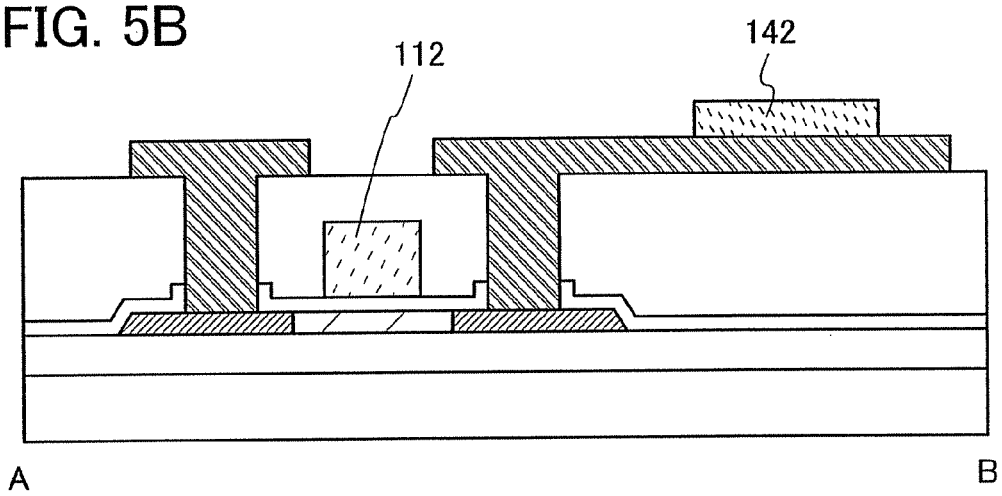

Then, as shown in FIGS. 5A and 5B, a pixel electrode 142 to be in contact with the drain electrode 132 of the thin film transistor is formed.

As the pixel electrode 142, a conductive layer having a light-transmitting property is formed using a material similar to that of the gate wiring 112, whereby a transmissive type liquid crystal display panel can be manufactured later. Further, a conductive layer having a reflecting property is formed using Ag (silver), Au (gold), Cu (copper), W (tungsten), Al (aluminum), or the like, whereby a reflective liquid crystal display panel can be manufactured later. Furthermore, the conductive layer having a light-transmitting property and the conductive layer having a reflecting property as described above are formed for each pixel, whereby a semi-transmissive liquid crystal display panel can be manufactured. Here, ITO containing silicon oxide is formed by a sputtering method.

Through the above steps, an active matrix substrate of a liquid crystal display device can be manufactured.

According to this embodiment mode, a plurality of light absorbing layers and an insulating layer formed over the plurality of light absorbing layers can be removed by selectively irradiating a region, in which the plurality of light absorbing layers is formed, with a linear laser beam; thus, a plurality of opening portions can be formed. Further, a semiconductor device can be manufactured at low cost.

Embodiment Mode 2

This embodiment mode describes a method for forming an opening portion in an insulating layer formed over a substrate by a process different from that in Embodiment Mode 1 in a pixel portion in which pixels each including a display element are arranged in matrix, with reference to FIGS. 6A to 10B. This embodiment mode is different from Embodiment Mode 1 in a step of removing a light absorbing layer by a laser beam. FIGS. 6A to 10B are top views and a cross-sectional views each illustrating a step of forming an opening portion in an insulating layer formed over a substrate. FIGS. 6B, 7B, 8B, 9B, and 10B show cross-sectional views taken along lines A-B in FIGS. 6A, 7A, 8A, 9A, and 10A, respectively.

In this embodiment mode, description is made with reference to a mode in which a plurality of light absorbing layers in a direction intersecting with a source wiring is irradiated with a linear laser beam in a pixel portion in which pixels which each include a display element are arranged in matrix.

Figure 6A:
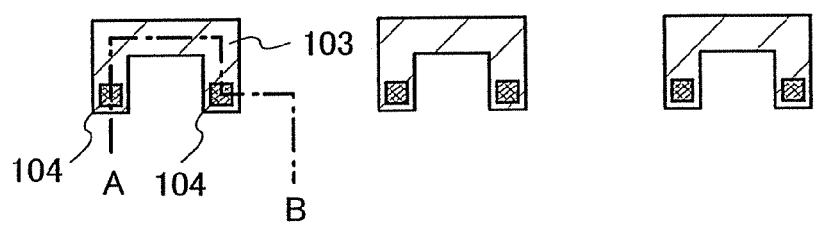
FIGS. 6A and 6B are a top view and a cross-sectional view, respectively, each illustrating a method for manufacturing a semiconductor device of the present invention.
Figure 6B:
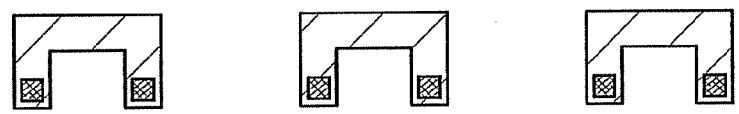

As shown in FIGS. 6A and 6B, in a similar manner to that of Embodiment Mode 1, a first layer 102 is formed over a substrate 101, a semiconductor layer is formed over the first layer 102 as a second layer 103, and a light absorbing layer 104 is formed over the semiconductor layer.

In this embodiment mode, in order to avoid linear alignment of a gate wiring and an opening portion, which are formed later, as shown in FIG. 6A, the semiconductor layer is formed with a U-shape and the light absorbing layer 104 is formed in an end portion of the semiconductor layer having the U-shape.

Then, as shown in FIGS. 7A and 7B, in a similar manner to that of Embodiment Mode 1, here, a gate insulating layer 111, a gate wiring 151, and an interlayer insulating layer 113 are sequentially formed as a layer having a light-transmitting property over the first layer 102, the second layer 103, and the light absorbing layer 104.

In this embodiment mode, the gate wiring 151 can be formed using a conductive layer which has a light-transmitting property, a conductive light-absorbing layer, a conductive layer which reflects light, or the like as appropriate. The gate wiring 151 is preferably formed using a conductive layer having low resistivity. A conductive layer having low resistivity may be formed using an element selected from tantalum (Ta), titanium (Ti), molybdenum (Mo), and tungsten (W), an alloy containing one of those elements as its main component, an alloy film in which the element is combined (typically, a Mo—W alloy film or a Mo—Ta alloy film), or a silicon film to which conductivity is imparted. For example, a stacked structure of a silicon layer and a germanium layer may be employed. Here, as the gate wiring 151, a tungsten layer having a thickness of 200 to 500 nm, preferably 300 to 400 nm, is formed by a sputtering method.

Then, in a region in which a layer having a light-transmitting property, which is a gate insulating layer 111 and an interlayer insulating layer 113 here, and a light absorbing layer 104 overlap with each other, the light absorbing layer 104 is irradiated with a laser beam 152. As the laser beam 152, a laser beam having conditions similar to that of the laser beam 114 used in Embodiment Mode 1 can be used.

In this embodiment mode, irradiation with the laser beam 152 is performed in a direction parallel to the gate wiring 151. Alternatively, the light absorbing layer 104 is selectively irradiated with the laser beam so that the gate wiring 151 is not irradiated with the laser beam 152.

In this embodiment mode, a mode is shown, in which a plurality of light absorbing layers 104 and a layer having a light-transmitting property in contact with the plurality of light absorbing layers are scattered by irradiating the plurality of light absorbing layers 104 with a linear laser beam 152, whereby an opening portion 121 is formed, as shown in FIGS. 8A and 8B. Further, there is another case where, by irradiating the plurality of light absorbing layers 104 with the linear laser beam 152, an upper layer portion of the light absorbing layer 104 and the layer having a light-transmitting property are scattered and a lower layer portion of the light absorbing layer 104 remains over the second layer 103. In such a case, a third layer, which is to be formed later, may be formed with the remaining light absorbing layer remaining. Alternatively, the third layer, which is to be formed later, may be formed after the remaining light absorbing layer 104 is removed by dry etching or wet etching and the second layer 103 is exposed.

Furthermore, there is another case where only the layer having a light-transmitting property in contact with the light absorbing layer 104 is removed by irradiation with the laser beam 152. In such a case, a third layer, which is to be formed later, may be formed with the remaining light absorbing layer 104 remaining. Alternatively, the third layer, which is to be formed later, may be formed after the remaining light absorbing layer 104 is removed by dry etching or wet etching.

Figure 9A:
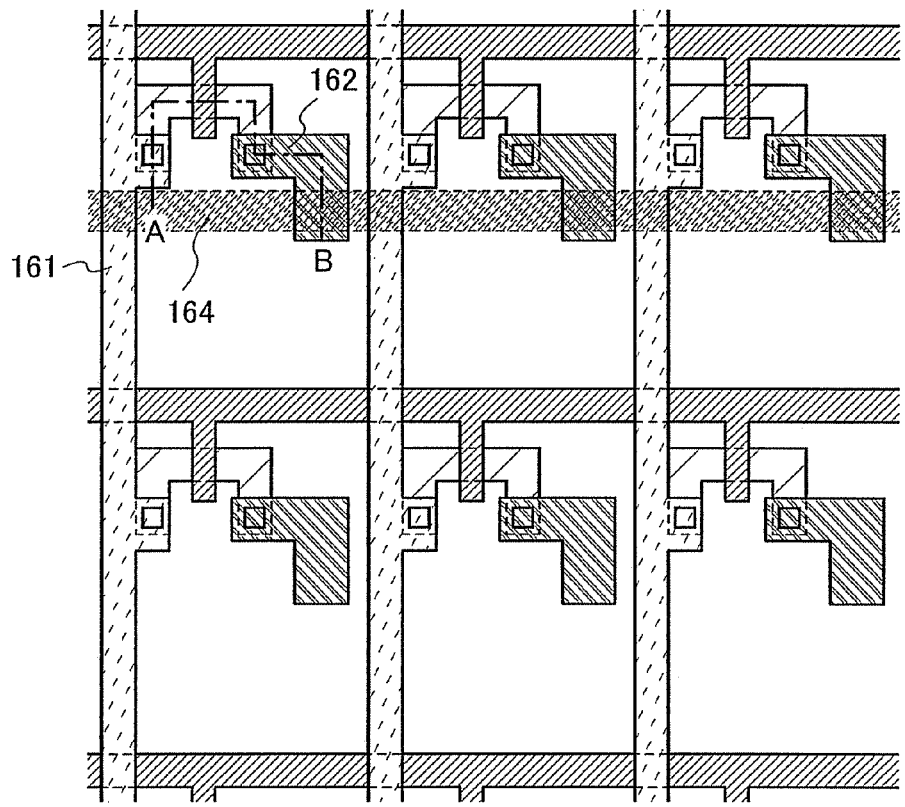
FIGS. 9A and 9B are a top view and a cross-sectional view, respectively, each illustrating a method for manufacturing a semiconductor device of the present invention.
Figure 9B:
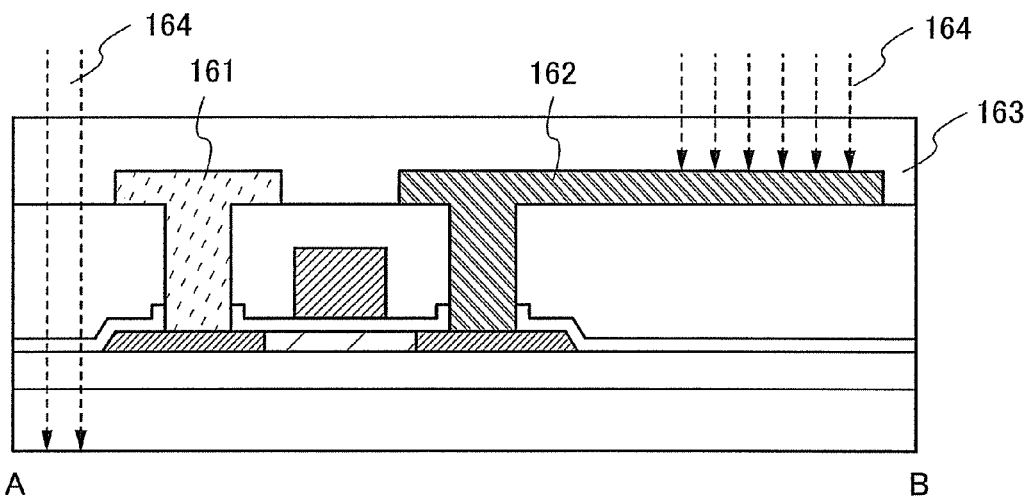

Then, as shown in FIGS. 9A and 9B, a third layer and a fourth layer are formed in opening portions 121. As the third layer and the fourth layer, an insulating layer, a semiconductor layer, or a conductive layer can be formed as appropriate. Here, a source wiring 161 is formed as the third layer and a drain electrode 162 is formed as the fourth layer. Since an opening portion is formed over the drain electrode 162 using a laser beam, the drain electrode 162 is formed as a light absorbing layer here. Further, when the opening portion is formed over the drain electrode 162, it is not necessary to form the opening portion over the source wiring 161. Therefore, the source wiring 161 is formed using a conductive layer having a light-transmitting property.

The source wiring 161 can be formed in a similar manner to the gate wiring 112 described in Embodiment Mode 1. Further, an auxiliary wiring formed using a conductive layer having low conductivity may be formed over the source wiring 161.

The drain electrode 162 can be formed in a similar manner to the source wiring 131 and the drain electrode 132 shown in Embodiment Mode 1.

Then, a layer 163 having a light-transmitting property is formed over the source wiring 161, the drain wiring 162, and the interlayer insulating layer 123. Here, as the layer 163 having a light-transmitting property, an insulating layer having a light-transmitting property is formed using a material similar to that of the interlayer insulating layer 113.

Figure 10A:
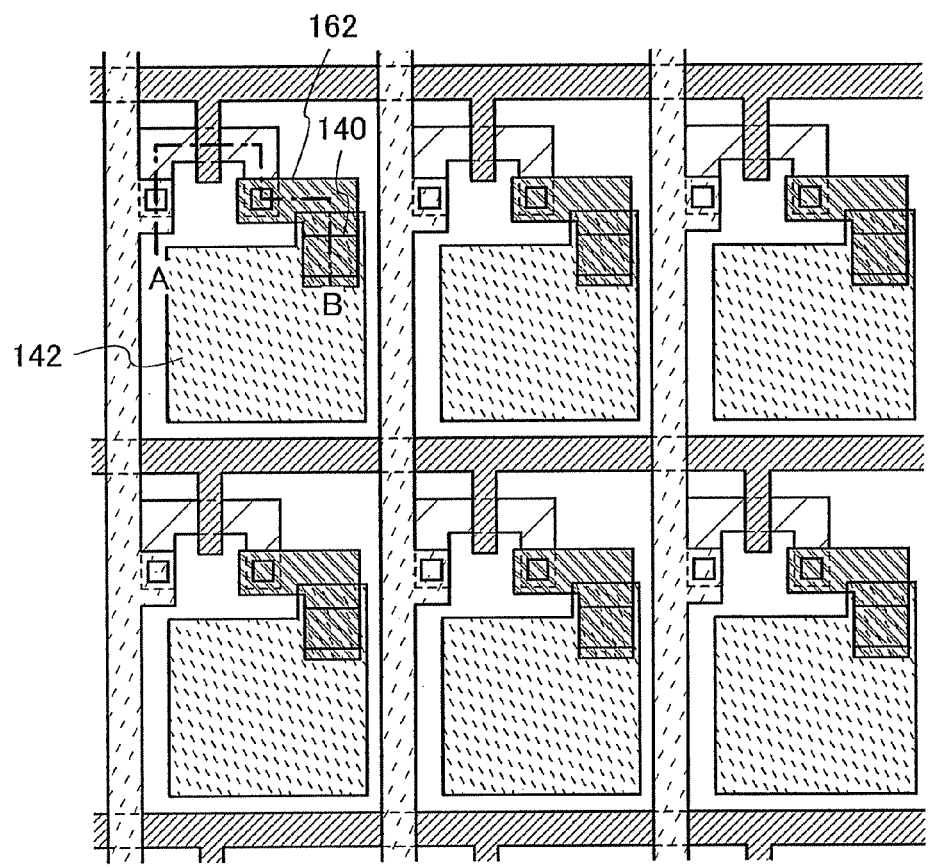
FIGS. 10A and 10B are a top view and a cross-sectional view, respectively, each illustrating a method for manufacturing a semiconductor device of the present invention.
Figure 10B:
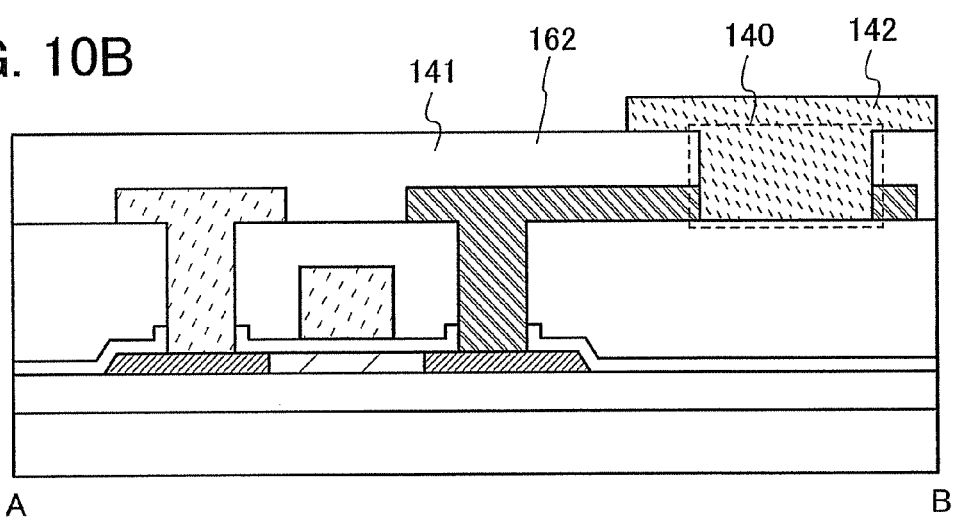

Then, part of the drain electrode 162 is irradiated with a laser beam 164, and part of the drain electrode 162 and part of the layer having a light-transmitting property are removed as shown in FIG. 10A, whereby a layer 141 having a light-transmitting property which has an opening portion 140 can be formed.

Then, a pixel electrode 142 is formed in the opening portion 140.

Through the above steps, an active matrix substrate of a liquid crystal display device can be manufactured.

According to this embodiment mode, a plurality of light absorbing layers and an insulating layer formed over the plurality of light absorbing layers can be removed by selectively irradiating a region, in which the plurality of light absorbing layers is formed, with a linear laser beam; thus, a plurality of opening portions can be formed. Further, a semiconductor device can be manufactured at low cost.

Embodiment 1

In this embodiment, a liquid crystal display device which is an example of a semiconductor device is described with reference to FIGS. 11A to 11C.

As shown in FIG. 11A, thin film transistors 225 to 227 are formed over a substrate 101. As a method for forming an opening portion which connects wirings 234 to 239 of the thin film transistors 225 to 227 and a semiconductor film, the above-described embodiment mode can be employed. In this embodiment, each gate electrode of the thin film transistors 225 to 227 is formed to have a two-layer structure. Here, after a tantalum nitride film with a thickness of 30 nm and a tungsten film with a thickness of 370 nm are formed over the gate insulating film by a sputtering method, a resist mask formed by a photolithography step is used to etch the tantalum nitride film and the tungsten film selectively, and the gate electrodes each having a shape that an end portion of the tantalum nitride film extends out farther to the outside than an end portion of the tungsten film are formed. The above-described embodiment mode is applied as appropriate for the other structures in the thin film transistor.

Next, as shown in FIG. 11A, a first interlayer insulating film which insulates the gate electrodes and the wirings of the thin film transistors 225 to 227 is formed. Here, the first interlayer insulating film is formed by stacking a silicon oxide film 231, a silicon nitride film 232, and a silicon oxide film 233. After forming an opening portion in the first interlayer insulating film using the above-described embodiment mode, wirings 234 to 239, which are connected to a source region and a drain region of the thin film transistors 225 to 227, and a connection terminal 240 are formed over the silicon oxide film 233 which is part of the first interlayer insulating film. Here, the wirings 234 to 239 and the connection terminal 240 are formed by sequentially forming a Ti film with a thickness of 100 nm, an Al film with a thickness of 333 nm, and a Ti film with a thickness of 100 nm, then performing etching selectively using a resist mask formed by a photolithography step. Then, the resist mask is removed.

Then, over the first interlayer insulating film, the wirings 234 to 239, and the connection terminal 240, a second interlayer insulating film 241 is formed. As the second interlayer insulating film 241, an inorganic insulating film such as a silicon oxide film, a silicon nitride film, or a silicon oxynitride film can be used, and the insulating film can be formed to have a single layer or a plurality of layers including two or more layers. As a method for forming an inorganic insulating film, a sputtering method, an LPCVD method, a plasma CVD method, or the like may be used. Here, a plasma CVD method is employed, and after forming a silicon nitride film containing oxygen with a thickness of 100 to 150 nm, using the above-described embodiment mode, the silicon nitride film containing oxygen is selectively etched to form opening portions which reach the wiring 239 of the thin film transistor 227 and the connection terminal 240, and thus, the second interlayer insulating film 241 is formed.

As is described in this embodiment, the formation of the second interlayer insulating film 241 can prevent exposure of TFTs, wirings, and the like of a driver circuit portion and protect TFTs from a contaminant.

Subsequently, a pixel electrode 242 connected to the wiring 239 of the thin film transistor 227, and a conductive film 244 connected to the connection terminal 240 are formed. In a case where the liquid crystal display device is a light transmissive type liquid crystal display device, the pixel electrode 242 is formed using a conductive film having a light-transmitting property. In a case where the liquid crystal display device is a reflective liquid crystal display device, the pixel electrode 242 is formed using a conductive film having reflectivity. Here, the pixel electrode 242 and the conductive film 244 are formed in such a way that after ITO containing silicon oxide with a thickness of 125 nm is formed by a sputtering method, etching is selectively performed with the use of a resist mask formed by a photolithography step.

Subsequently, an insulating film 243 which functions as an orientation film is formed. The insulating film 243 can be formed in such a way that a high molecular compound film such as a polyimide, polyvinyl alcohol, or the like is formed by a roll coating method, a printing method, or the like, and then rubbing is performed. Further, the insulating film 243 can be formed by evaporation of SiO from an oblique angle to the substrate, and the insulating film 243 can be formed by irradiating a photoreactive type high molecular compound with polarized UV light and polymerizing of the photoreactive type high molecular compound; however, here the insulating film 243 is formed by printing a high molecular compound film such as polyimide, polyvinyl alcohol, or the like, and baking, and then performing rubbing.

Subsequently, as shown in FIG. 11B, an opposing electrode 253 is formed over an opposing substrate 251, and an insulating film 254 is formed over the opposing electrode 253 which functions as an orientation film. A colored film 252 may be formed between the opposing substrate 251 and the opposing electrode 253.

The opposing substrate 251 may be appropriately formed by the material similar to that of the substrate 101. The opposing electrode 253 is formed using a conductive film having a light-transmitting property. The insulating film 254 which functions as an orientation film can be formed in a similar manner to the insulating film 243. The colored film 252 is a film which is necessary when color display is performed, and in a RGB method, a colored film in which dye or pigment corresponding to each color of red, green, and blue is dispersed is formed corresponding to each pixel.

Subsequently, the substrate 101 and the opposing substrate 251 are attached together with a sealing material 257, and a liquid crystal layer 255 is formed between the substrate 101 and the opposing substrate 251. The liquid crystal layer 255 is formed in such a way that a liquid crystal material is injected into a region surrounded by the insulating films 243 and 254 which function as orientation films and the sealing material 257 by a vacuum injection method using capillary tube phenomenon. Alternatively, the sealing material 257 is formed at one surface of the opposing substrate 251, a liquid crystal material is delivered by drops to a region surrounded by the sealing material, and after that the liquid crystal layer 255 can be formed by pressure bonding of the opposing substrate 251 and the substrate 101 under reduced pressure with the sealing material.

As the sealing material 257, a thermoset epoxy resin, a UV curable acrylic resin, thermoplastic nylon, polyester, or the like can be formed by a dispenser method, a printing method, a thermocompression method, or the like. Note that by spraying filler to the sealing material 257, a space between the substrate 101 and the opposing substrate 251 can be maintained. Here, as the sealing material 257, a thermoset epoxy resin is used.

In addition, in order to maintain the space between the substrate 101 and the opposing substrate 251, spacers 256 may be provided between the insulating films 243 and 254 which function as orientation films. The spacer can be formed by application of an organic resin, and by etching of the organic resin to be a desired shape, typically, a pillar or circular pillar shape. Moreover, as the spacer, a bead spacer may be used, and here as the spacer 256, a bead spacer is used.

In addition, although not shown, a polarizing plate is provided for one or both of the substrate 100 and the opposing substrate 251.

Subsequently, as shown in FIG. 11C, in a terminal portion 263, a connection terminal connected to a gate wiring and a source wiring of a thin film transistor (in FIG. 11C, the connection terminal 240 connected to a source wiring or a drain wiring is shown) is formed. An FPC (flexible printed circuit) 262 to be an input terminal portion is connected to the connection terminal 240 through the conductive film 244 and an anisotropic conductive film 261, and the connection terminal 240 receives video signals and clock signals through the conductive film 244 and the anisotropic conductive film 261.

In a driver circuit portion 264, a circuit which drives a pixel such as a source driver, a gate driver, and the like is formed, and here the n-channel thin film transistor 226 and the p-channel thin film transistor 225 are placed. In addition, a CMOS circuit is formed using the n-channel thin film transistor 226 and the p-channel thin film transistor 225.

In a pixel portion 265, a plurality of pixels is formed, and at each pixel, a liquid crystal element 258 is formed. This liquid crystal element 258 is a portion where the pixel electrode 242, the opposing electrode 253, and the liquid crystal layer 255 which fills the space between the pixel electrode 242 and the opposing electrode 253 overlaps with each other. The pixel electrode 242 included in the liquid crystal element 258 is electrically connected to the thin film transistor 227.

Through the above process, a liquid crystal display device can be manufactured.

Although a TN-mode liquid crystal display panel is shown in FIGS. 11A to 11C, the method for forming an opening portion of the present invention can be similarly applied to other types of liquid crystal display panels. For example, this embodiment can be applied to a horizontal electric field liquid crystal display panel, in which a liquid crystal is oriented by applying an electric field parallel to a glass substrate. Further, this embodiment can be applied to a liquid crystal display panel with a VA (Vertical Alignment) mode.

Figure 13:
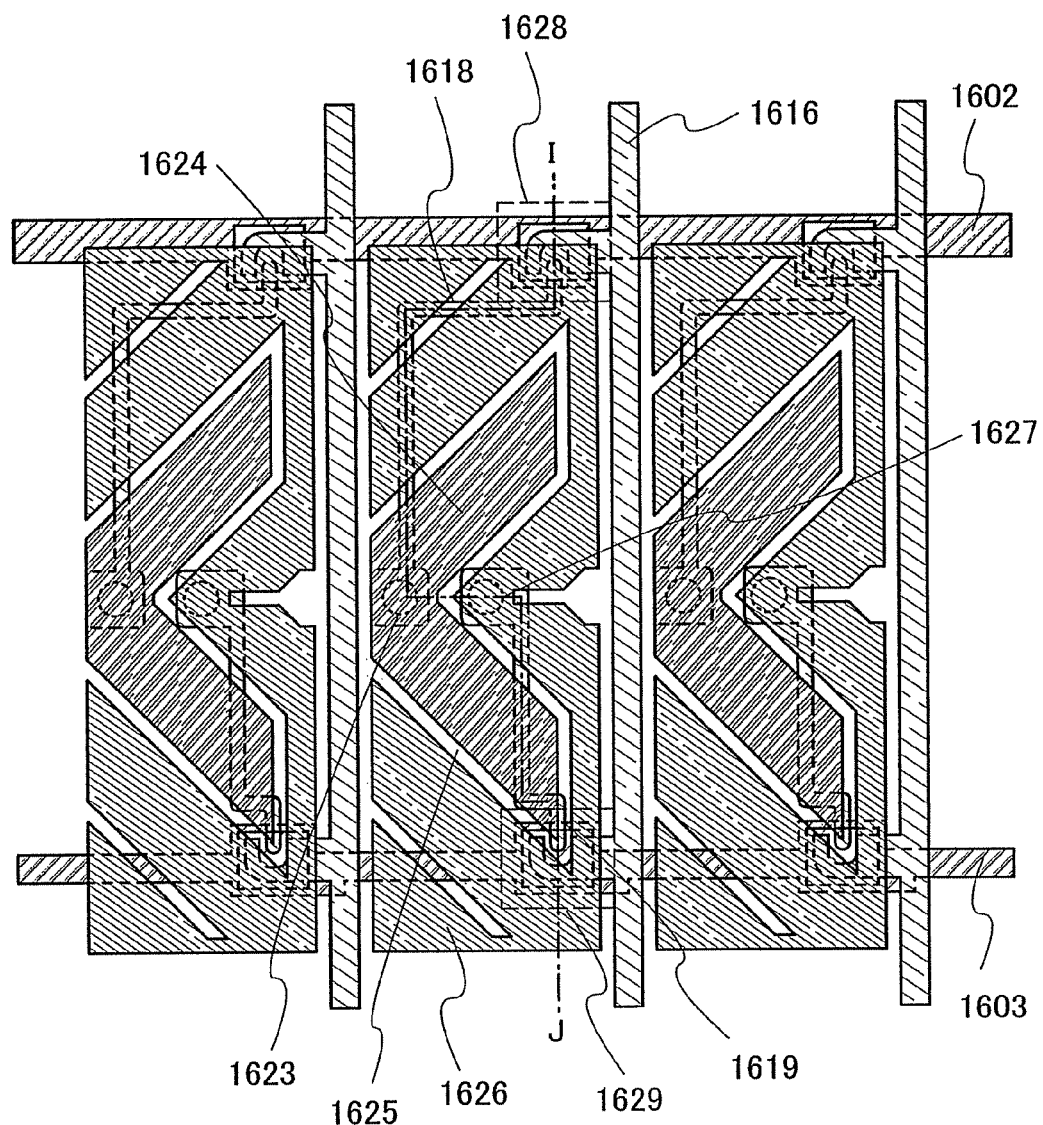
FIG. 13 is a top view illustrating a method for manufacturing a semiconductor device of the present invention.
Figure 14:
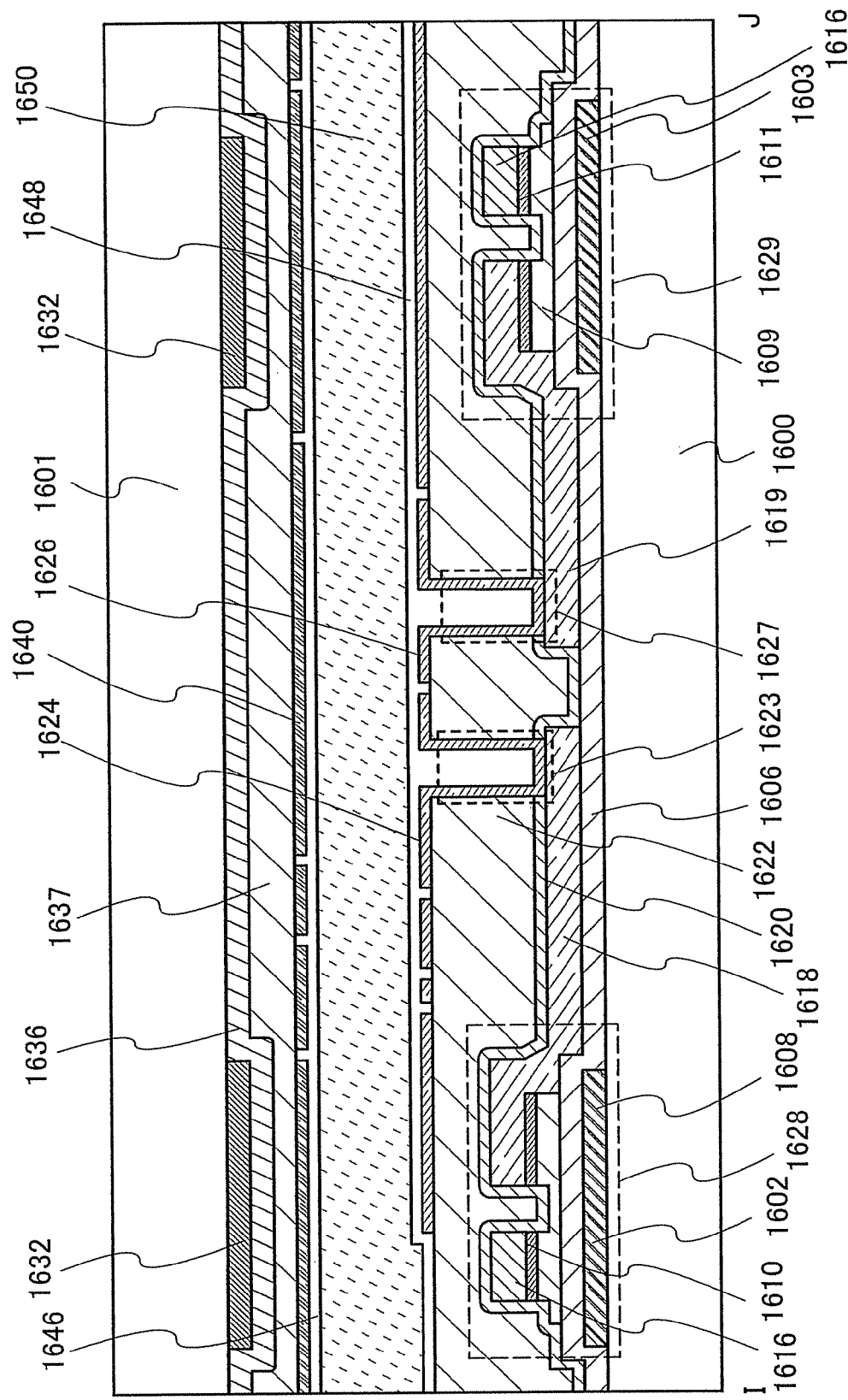
FIG. 14 is a cross-sectional view illustrating a method for manufacturing a semiconductor device of the present invention.

FIGS. 13 and 14 show a pixel structure of a VA-type liquid crystal display panel. FIG. 13 is a plane view, and FIG. 14 shows a cross-sectional structure taken along a line I-J shown in FIG. 13. The following description will be made with reference to both the figures. FIGS. 13 and 14 are shown using an example of an inverted staggered thin film transistor as a thin film transistor.

In this pixel structure, one pixel has a plurality of pixel electrodes, and a TFT is connected to each pixel electrode. Each TFT is formed so as to be driven with a different gate signal. Specifically, a pixel of multi-domain design has a structure in which a signal applied to each pixel electrode is independently controlled.

A pixel electrode 1624 is connected to a TFT 1628 through a wiring 1618 by an opening portion 1623. In addition, a pixel electrode 1626 is connected to a TFT 1629 through a wiring 1619 by an opening portion 1627. A gate wiring 1602 of the TFT 1628 is separated from a gate electrode 1603 of the TFT 1629 so that different gate signals can be supplied. On the other hand, a wiring 1616 serving as a data line is shared by the TFTs 1628 and 1629.

The shape of the pixel electrode 1624 is different from that of the pixel electrode 1626, and the pixel electrodes are separated by a slit 1625. The pixel electrode 1626 is formed so as to surround the outside of the pixel electrode 1624, which spreads out in a V-shape. The timing of voltages applied to the pixel electrodes 1624 and 1626 is made different by the TFTs 1628 and 1629, whereby orientation of liquid crystals is controlled. A light shielding film 1632, a colored layer 1636, and an opposing electrode 1640 are formed over an opposing substrate 1601. Further, a planarizing film 1637 is formed between the colored layer 1636 and the opposing electrode 1640, thereby preventing disorder in the orientation of liquid crystals.

Figure 15:
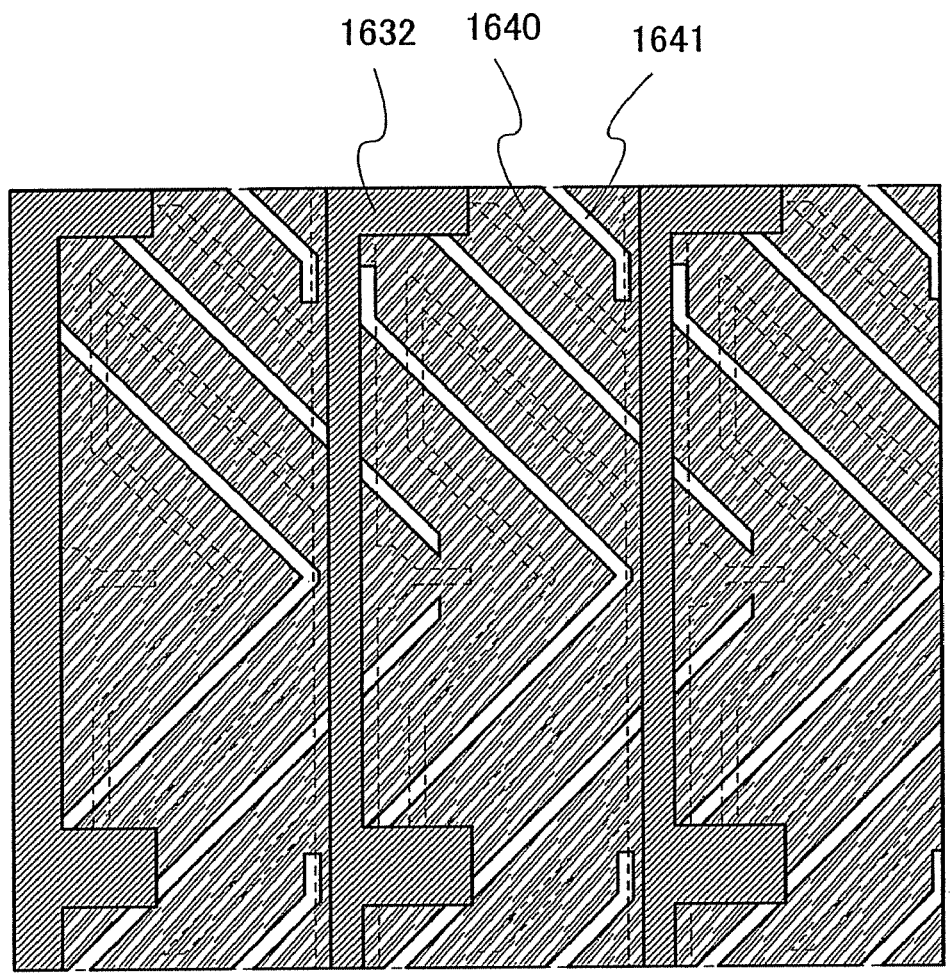
FIG. 15 is a top view illustrating a method for manufacturing a semiconductor device of the present invention.

FIG. 15 shows a structure of the opposite substrate side. The opposite electrode 1640 is an electrode shared by different pixels, and a slit 1641 is formed. This slit 1641 is disposed so as to alternately mesh with a slit 1625 on the sides of the pixel electrodes 1624 and 1626, whereby an oblique electric field is generated effectively to control orientation of liquid crystals. Accordingly, the direction in which liquid crystals are oriented can be made different depending on a place, and a viewing angle of the liquid crystal panel is expanded.

It is to be noted that a protective circuit for preventing electrostatic discharge failure, typically a diode or the like, may be provided between the connection terminal and a source wiring (or gate wiring), or in the pixel portion. In this case, the diode is manufactured through the same steps as the above-described TFT. The electrostatic discharge can be prevented by connecting a gate wiring in the pixel portion and a drain or source wiring of the diode.

This embodiment can be freely and appropriately combined with the above embodiment modes.

With this embodiment, a process of forming an opening portion in a semiconductor device can be performed by a simple process. Further, a semiconductor device can be manufactured at low cost.

Embodiment 2

In this embodiment, a manufacturing step of a light-emitting device having a light-emitting element, which is an example of a semiconductor device, is described.

As shown in FIG. 12A, thin film transistors 225 to 227 are formed over a substrate 101 with a first layer 102 interposed therebetween in a similar manner to that in Embodiment 1. A first interlayer insulating film for insulating the gate electrodes and the wirings of the thin film transistors 225 to 227 is formed by stacking a silicon oxide film 231, a silicon nitride film 232, and a silicon oxide film 233. Moreover, after an opening portion is formed in the first interlayer insulating film according to the above-described embodiment mode, wirings 308 to 313 which are connected to the semiconductor films of the thin film transistors 225 to 227, and a connection terminal 314 are formed over the silicon oxide film 233, which is part of the first interlayer insulating film.

Next, a second interlayer insulating layer 315 is formed over the first interlayer insulating film, the wirings 308 to 313, and the connection terminal 314, and then a first electrode 316 which is connected to the wiring 313 of the thin film transistor 227 and a conductive film 320 which is connected to the connection terminal 314 are formed. The first electrode 316 and the conductive film 320 are formed in such a way that after ITO containing silicon oxide is formed to have a thickness of 125 nm by a sputtering method, the ITO is selectively etched by using a resist mask formed by a photolithography step.

As is described in this embodiment, the formation of the second interlayer insulating film 315 can prevent exposure of TFTs, wirings, and the like of a driver circuit portion and protect TFTs from a contaminant.

Next, an organic insulating film 317 is formed to cover an end portion of the first electrode 316. Here, after applying and baking photosensitive polyimide, light-exposure and development are carried out, thereby forming the organic insulating film 317 so that the driver circuit, the first electrode 316 in a pixel region, and the second interlayer insulating film 315 in a periphery of the pixel region are exposed.

Next, a layer 318 containing a light-emitting substance is formed by an evaporation method over part of the first electrode 316 and the organic insulating film 317. The layer 318 containing a light-emitting substance is formed of an organic compound having a light-emitting property or an inorganic compound having a light-emitting property. It is to be noted that the layer 318 containing a light-emitting substance may be formed of an organic compound having a light-emitting property and an inorganic compound having a light-emitting property. Moreover, a red-light-emitting pixel, a blue-light-emitting pixel, and a green-light-emitting pixel can be formed by using a red-light-emitting substance, a blue-light-emitting substance, and a green-light-emitting substance, respectively, for the layer 318 containing a light-emitting substance.

Here, the layer containing a red-light-emitting substance is formed by stacking DNTPD of 50 nm thick, NPB of 10 nm thick, NPB of 30 nm thick to which bis[2,3-bis(4-fluorophenyl)quinoxalinato]iridium(acetylacetonate) (abbr.: Ir(Fdpq)$_2$(acac)) is added, Alq$_3$ of 60 nm thick, and LiF of 1 nm thick.

The layer containing a green-light-emitting substance is formed by stacking DNTPD of 50 nm thick, NPB of 10 nm thick, Alq$_3$ of 40 nm thick to which coumarin 545T (C545T) is added, Alq$_3$ of 60 nm thick, and LiF of 1 nm thick.

The layer containing a blue-light-emitting substance is formed by stacking DNTPD of 50 nm thick, NPB of 10 nm thick, 9-[4-(N-carbazolyl)]phenyl-10-phenylanthracene (abbr.: CzPA(:)) of 30 nm thick to which 2,5,8,11-tetra(tert-butyl)perylene (abbr.: TBP) is added, Alq$_3$ of 60 nm thick, and LiF of 1 nm thick.

Moreover, a white-light-emitting pixel may be formed by forming the layer containing a light-emitting substance with a white light-emitting substance, in addition to the red-light-emitting pixel, the blue-light-emitting pixel, and the green-light-emitting pixel. By providing a white-light-emitting pixel, power consumption can be reduced.

Next, a second electrode 319 is formed over the layer 318 containing a light-emitting substance and the organic insulating film 317. Here, an Al film is formed in 200 nm thick by an evaporation method. Accordingly, a light-emitting element 321 is formed using the first electrode 316, the layer 318 containing a light-emitting substance, and the second electrode 319.

Although the layer containing a light-emitting substance is formed using an organic compound here, the present invention is not limited to this. For example, the layer containing a light-emitting substance may be formed using an inorganic compound. Furthermore, the layer containing a light-emitting substance may be formed by stacking an organic compound and an inorganic compound.

Next, as shown in FIG. 12B, a protective film 322 is formed over the second electrode 319. The protective film 322 is to prevent intrusion of moisture, oxygen, and the like into the light-emitting element 321 and the protective film 322. The protective film 322 is preferably formed using silicon nitride, silicon oxide, silicon nitride oxide, silicon oxynitride, aluminum oxynitride, aluminum oxide, diamond-like carbon (DLC), carbon containing nitrogen (CN), or another insulating material by a thin-film forming method such as a plasma CVD method or a sputtering method.

In addition, by attaching a sealing substrate 324 to the second interlayer insulating film 315 over the substrate 101 with the use of a sealant 323, the light-emitting element 321 is provided in a space 325 surrounded by the substrate 101, the sealing substrate 324, and the sealant 323. The space 325 may be filled with filler, which may be an inert gas (such as nitrogen or argon) or the sealant 323.

An epoxy-based resin is preferably used for the sealant 323, and the material of the sealant 323 desirably does not transmit moisture and oxygen as much as possible. As the sealing substrate 324, a glass substrate, a quartz substrate, or a plastic substrate formed of FRP (Fiberglass-Reinforced Plastics), PVF (polyvinyl fluoride), a polyester film, polyester, acrylic, or the like can be used.

Subsequently, as shown in FIG. 12C, an FPC 327 is attached to the conductive layer 320 which is in contact with the connection terminal 314, by using an anisotropic conductive film 326 in a similar manner to that in Embodiment 1.

Through the above steps, a semiconductor device having an active matrix light-emitting element can be formed.

Figure 16A:
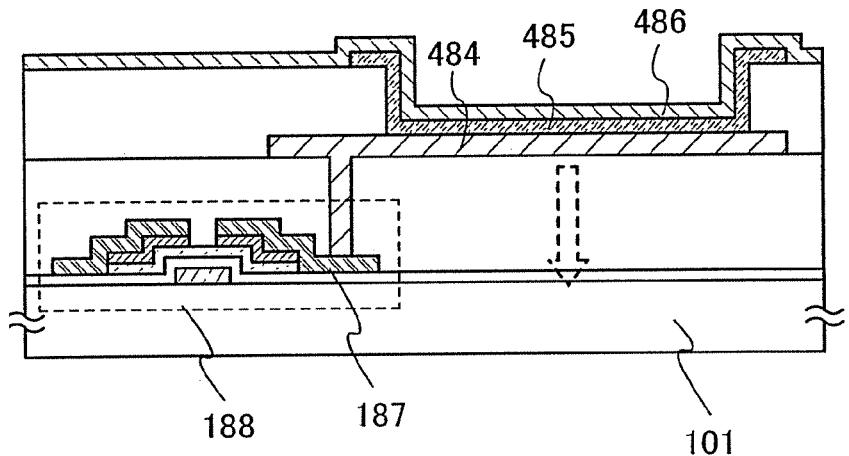
FIGS. 16A to 16C are views each illustrating a cross-sectional structure of a semiconductor element which is applicable to the present invention.

Here, a case where light is emitted to the substrate 101 side, that is, a case of bottom emission, in a light-emitting display panel having a light-emitting element shown in FIG. 12C is described with reference to FIG. 16A. In this case, a conductive layer 484 having a light-transmitting property is formed to be in contact with a source electrode or drain electrode 187 so as to be electrically connected to the thin film transistor 188. The conductive layer 484 having a light-transmitting property, a layer 485 containing a light-emitting substance, and a conductive layer 486 having a light-shielding property or a light-reflecting property are sequentially stacked. It is necessary that a substrate 101 through which light is transmitted has a light-transmitting property with respect to light in at least a visible region.

Figure 16B:
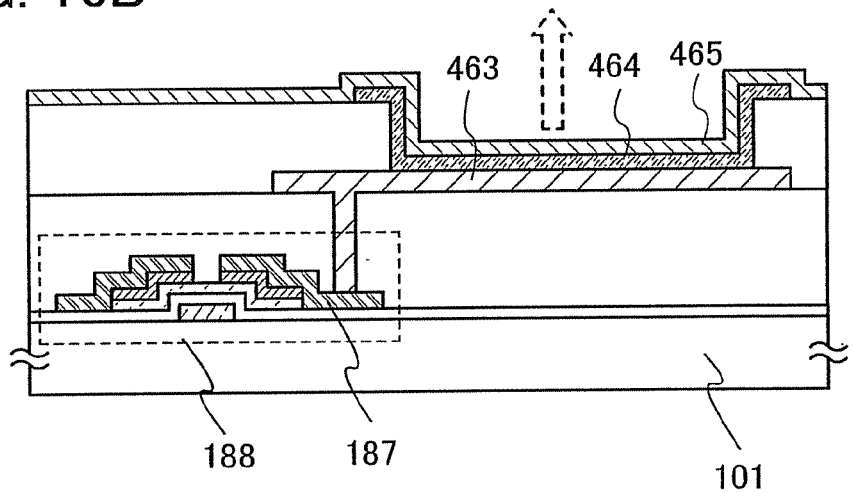

Next, a case where light is emitted to the side opposite to the substrate 101, that is, a case of top emission, is described with reference to FIG. 16B. A thin film transistor 188 can be formed in a similar manner to the above-described thin film transistor. A source electrode or drain electrode 187 is formed to be in contact with a conductive layer 463 having a light-shielding property or a light-reflecting property so as to be electrically connected to the thin film transistor 188. The conductive layer 463 having a light-shielding property or a light-reflecting property, a layer 464 containing a light-emitting substance, and a conductive layer 465 having a light-transmitting property are sequentially stacked. The conductive layer 463 is a metal layer having a light-shielding property or a light-reflecting property, and therefore light emitted from the light-emitting element is emitted to above the light-emitting element as indicated by an arrow. A conductive layer having a light-transmitting property may be formed over the conductive layer 463 having a light-shielding property or a light-reflecting property. Light emitted out from the light-emitting element is emitted through the conductive layer 465.

Figure 16C:
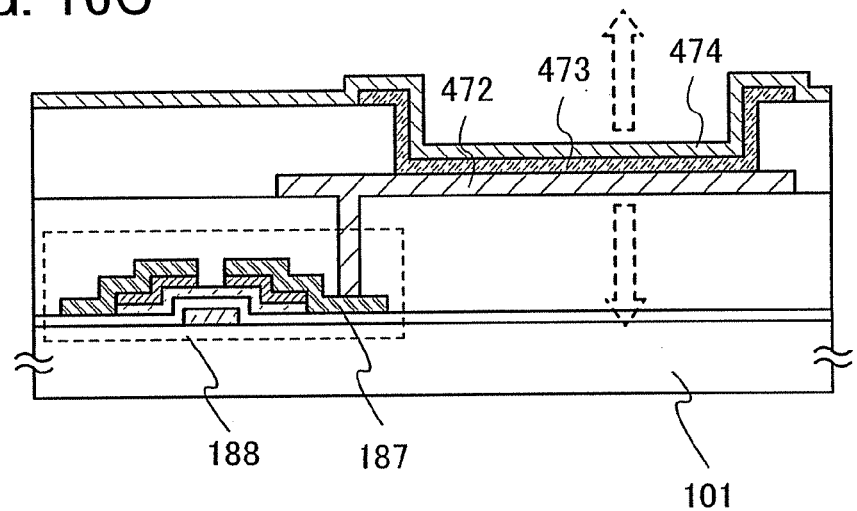

Next, a case where light is emitted to both the substrate 101 side and the side opposite to the substrate 101, that is, a case of dual emission, is described with reference to FIG. 16C. A source electrode or drain electrode 187, which is electrically connected to a semiconductor film of a thin film transistor 188, is electrically connected to a first conductive layer 472 having a light-transmitting property. The first conductive layer 472 having a light-transmitting property, a layer 473 containing a light-emitting substance, and a second conductive layer 474 having a light-transmitting property are sequentially stacked. When both the first conductive layer 472 having a light-transmitting property and the second conductive layer 474 having a light-transmitting property are formed using a material having a light-transmitting property with respect to light in at least the visible region, or formed with a thickness through such that light can be transmitted through them, dual emission is realized. In this case, it is necessary that an insulating film through which light is transmitted and a substrate 101 through which light is transmitted, have a light-transmitting property with respect to light in at least the visible region.

In the light-emitting device, the driving method of screen display is not particularly limited. For example, a dot-sequential driving method, a line-sequential driving method, a plane-sequential driving method, or the like may be used. Typically, the line sequential driving method is used, and may be appropriately combined with a time-division grayscale driving method or an area grayscale driving method. In addition, a video signal to be inputted into a source line of the light-emitting device may be an analog signal or a digital signal. A driving circuit or the like may be appropriately designed in accordance with the video signal.

It is to be noted that, although an inverted staggered thin film transistor is used as the thin film transistor 188, a top-gate thin film transistor can be appropriately used.

Further, in a light-emitting device using a digital video signal, there are two kinds of driving systems in which video signals inputted into a pixel are ones with constant voltage (CV) and in which video signals inputted into a pixel are ones with constant current (CC). Further, as for the driving system using video signals with constant voltage (CV), there are two kinds of systems in which voltage applied to a light emitting element is constant (CVCV), and in which current applied to a light emitting element is constant (CVCC). In addition, as for the driving system using video signals with constant current (CC), there are two kinds of systems in which voltage applied to a light emitting element is constant (CCCV), and in which current applied to a light emitting element is constant (CCCC).

In a case where the layer containing a light-emitting substance is formed using an inorganic compound, an operation is possible with either a DC drive or an AC drive.

Further, a protective circuit (such as a protective diode) for preventing electrostatic discharge damage may be provided in a light-emitting device.

Through the above steps, a light-emitting device having an active matrix light-emitting element can be manufactured. The light-emitting device shown in this embodiment can be formed through a simple process of forming an opening portion. Further, a semiconductor device can be manufactured at low cost.

Embodiment 3

Figure 17:
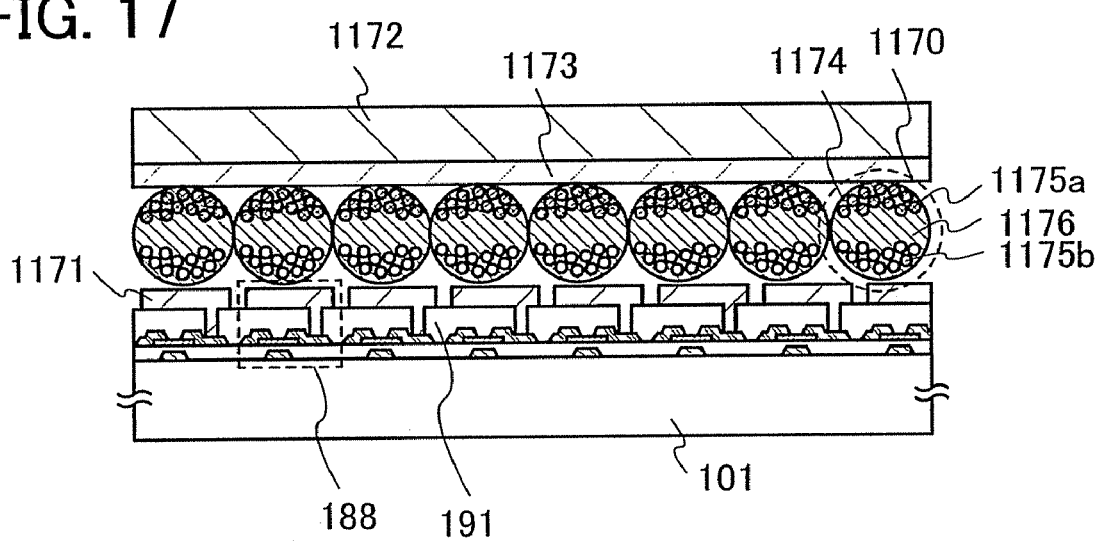
FIG. 17 is a cross-sectional view illustrating a method for manufacturing a semiconductor device of the present invention.

This embodiment will describe a typical example of a semiconductor device with reference to FIG. 17 and FIGS.

18A to 18D. An electrophoretic element is an element in which a microcapsule containing black and white particles which are charged positively and negatively is arranged between a first conductive layer and a second conductive layer, and a potential difference is generated between the first conductive layer and the second conductive layer, so that the black and white particles are moved between electrodes, and thus display is performed.

As shown in FIG. 17, a thin film transistor 188 and an insulating film 191 which covers the thin film transistor 188 and has an opening portion are formed over a substrate 101. The opening portion is formed using the above-described embodiment mode.

Then, a first conductive layer 1171 which is connected to a source wiring or a drain wiring of the thin film transistor is formed. The first conductive layer 1171 serves as a pixel electrode. Here, the first conductive layer 1171 is formed using aluminum.

Further, a second conductive layer 1173 is formed over a substrate 1172. Here, the second conductive layer 1173 is formed using ITO.

Next, the substrate 101 and the substrate 1172 are attached to each other using a sealing material. At this time, microcapsules 1170 are dispersed between the first conductive layer 1171 and the second conductive layer 1173, whereby an electrophoretic element is formed between the substrate 101 and the substrate 1172. The electrophoretic element includes the first conductive layer 1171, the microcapsules 1170, and the second conductive layer 1173. Further, the microcapsule 1170 is fixed between the first conductive layer 1171 and the second conductive layer 1173 with a binder.

Figure 18A:
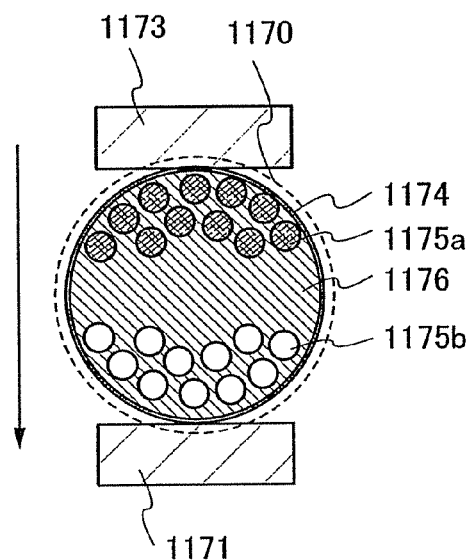
FIGS. 18A to 18D are views illustrating cross-sectional structures of electrophoretic elements which are applicable to the present invention.
Figure 18B:
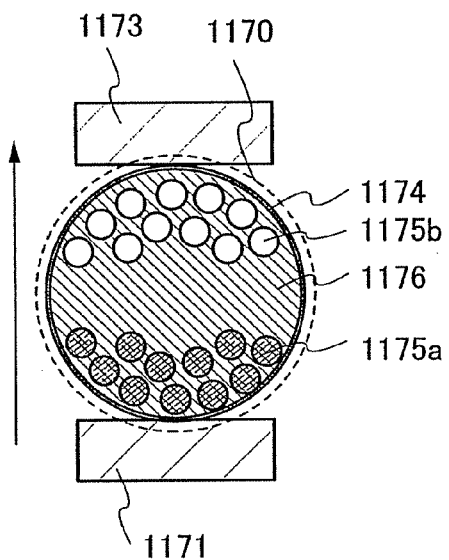
Figure 18C:
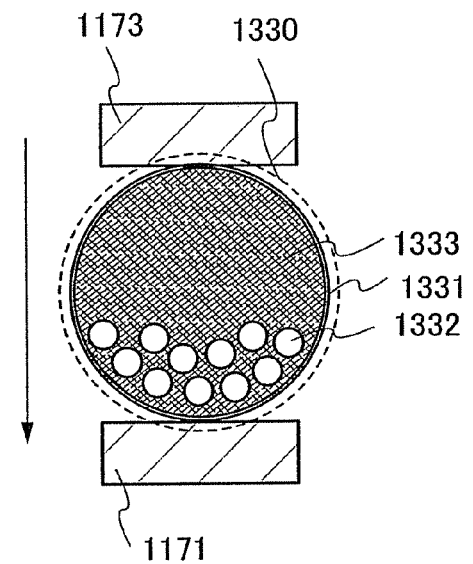
Figure 18D:
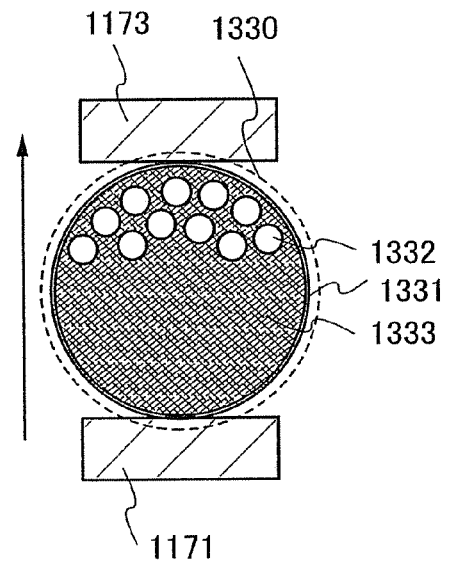

Next, structures of the microcapsule are described with reference to FIGS. 18A to 18D. As shown in FIGS. 18A and 18B, in the microcapsule 1170, a transparent dispersion medium 1176, charged black particles 1175a, and charged white particles 1175b are sealed in a fine transparent container 1174. Note that blue particles, red particles, green particles, yellow particles, blue-green particles, or reddish-violet particles may be used instead of the black particles 1175a. Further, as shown in FIGS. 18C and 18D, a microcapsule 1330 in which a colored dispersion medium 1333 and white particles 1332 are sealed in a fine transparent container 1331 may be used. Note that the colored dispersion medium 1333 may be colored any one of black, blue, red, green, yellow, blue green, reddish violet, and the like. In addition, when a microcapsule in which blue particles are dispersed, a microcapsule in which red particles are dispersed, and a microcapsule in which green particles are dispersed are provided in one pixel, color display can be performed. In addition, when each of a microcapsule in which yellow particles are dispersed, a microcapsule in which blue green particles are dispersed, and a microcapsule in which reddish violet particles are dispersed are provided in one pixel, color display can be performed. Further, when each of a microcapsule having a blue dispersion medium, a microcapsule having a red dispersion medium, and a microcapsule having a green dispersion medium each are provided in one pixel, and each of the microcapsules includes either white particles or black particles, color display can be performed. In addition, when a microcapsule having a yellow dispersion medium, a microcapsule having a blue-green dispersion medium, and a microcapsule having a reddish-violet dispersion medium are each provided in one pixel, and either white particles or black particles are dispersed in each of the microcapsules, color display can be performed.

Next, a display method using an electrophoretic element is shown. Specifically, FIGS. 18A and 18B are used to show a display method of the microcapsule 1170 having two color particles. Here, a white particle and a black particle are used as two color particles, and a microcapsule having a transparent dispersion medium is shown. Note that a particle having another color particle may be used instead of the black particle of the two color particles.

In the microcapsule 1170, the black particles 1175a are charged positively and the white particles 1175b are charged negatively, and voltage is applied to the first conductive layer 1171 and the second conductive layer 1173. Here, as indicated by an arrow, when an electric field is generated in a direction going from the second conductive layer to the first conductive layer, the black particles 1175a migrate to the second conductive layer 1173 side and the white particles 1175b migrate to the first conductive layer 1171 side, as shown in FIG. 18A. Accordingly, when the microcapsule is seen from the first conductive layer 1171 side, white is observed, and when the microcapsule is seen from the second conductive layer 1173 side, black is observed.

On the other hand, as indicated by an arrow, when voltage is applied in a direction going from the first conductive layer 1171 to the second conductive layer 1173, the black particles 1175a migrate to the first conductive layer 1171 side and the white particles 1175b migrate to the second conductive layer 1173 side as shown in FIG. 18B. Accordingly, when the microcapsule is seen from the first conductive layer 1171 side, black is observed, and when the microcapsule is seen from the second conductive layer 1173 side, white is observed.

Next, a display method of the microcapsule 1330 having the white particles and the colored dispersion medium is shown. Although an example in which a dispersion medium is colored black is shown here, a dispersion medium colored another color may be similarly used.

In the microcapsule 1330, the white particles 1332 are charged negatively, and voltage is applied to the first conductive layer 1171 and the second conductive layer 1173. Here, as indicated by an arrow, when an electric field is generated in a direction going from the second conductive layer to the first conductive layer, the white particles 1332 migrate to the first conductive layer 1171 side, as shown in FIG. 18C. Accordingly, when the microcapsule is seen from the first conductive layer 1171 side, white is observed, and when the microcapsule is seen from the second conductive layer 1173 side, black is observed.

On the other hand, as indicated by an arrow, when an electric field is generated in a direction going from the first conductive layer to the second conductive layer, the white particles 1332 migrate to the second conductive layer 1173 side, as shown in FIG. 18D. Accordingly, when the microcapsule is seen from the first conductive layer 1171 side, black is observed, and when the microcapsule is seen from the second conductive layer 1173 side, white is observed.

Although description is made with reference to an electrophoretic element here, a display device which uses a twisted ball display method may be used instead of the electrophoretic element. A twisted ball display method is a method in which spherical particles each colored in black and white are arranged between the first conductive layer and the second conductive layer. Display is performed by generating a potential difference between the first conductive layer and the second conductive layer to control the direction of the spherical particles.

Further, as a switching element, a MIM (Metal-Insulator-Metal), a diode, or the like can be used instead of a thin film transistor.

A display device having an electrophoretic element and a display device which uses a twisted ball display method maintain a state similar to that of when voltage is applied, for a long time after the power is turned off. Therefore, a state of display can be maintained even after the power is turned off. Accordingly, low power consumption is possible.

Through the above steps, a semiconductor device including an electrophoretic element can be manufactured. The light-emitting device shown in this embodiment can be formed through a simple process of forming an opening portion. Further, a semiconductor device can be manufactured at low cost.

Embodiment 4

Below, an example is described of a display panel (a light-emitting display panel, a liquid crystal display panel, or an electrophoretic display panel) manufactured in accordance with any of Embodiments 1 to 3, in which a semiconductor film is formed using an amorphous semiconductor or a semi-amorphous silicon (SAS) and a scanning line driver circuit is formed over a substrate.

Figure 19:
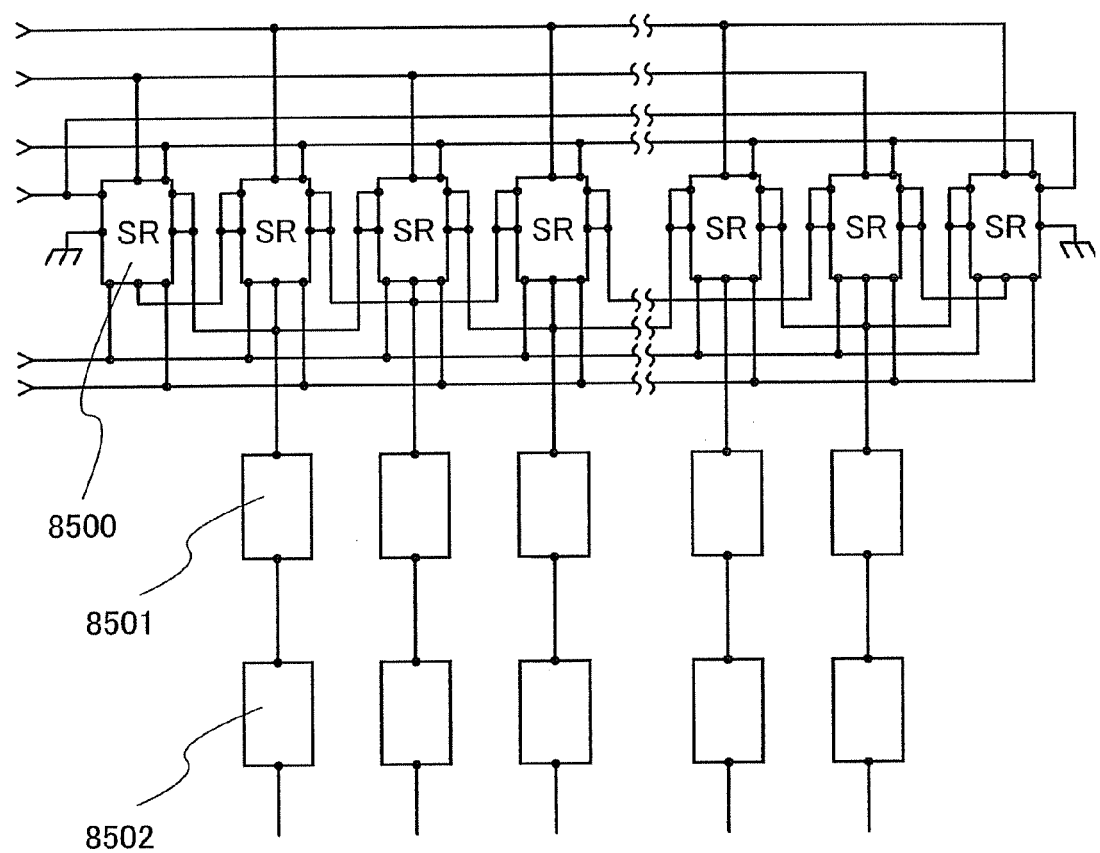
FIG. 19 is a diagram illustrating a circuit configuration for a case where a scanning line driver circuit is formed using a TFT in a display panel of the present invention.

FIG. 19 is a block diagram of a scanning line driver circuit formed using an n-channel TFT that uses an SAS with an electron field-effect mobility of 1 to 15 $cm^2/V \cdot sec$.

In FIG. 19, a block 8500 corresponds to a pulse output circuit outputting sampling pulses for one stage. A shift register includes n number of pulse output circuits. Reference numeral 8501 denotes a buffer circuit and a pixel 8502 is connected to the buffer circuit.

Figure 20:
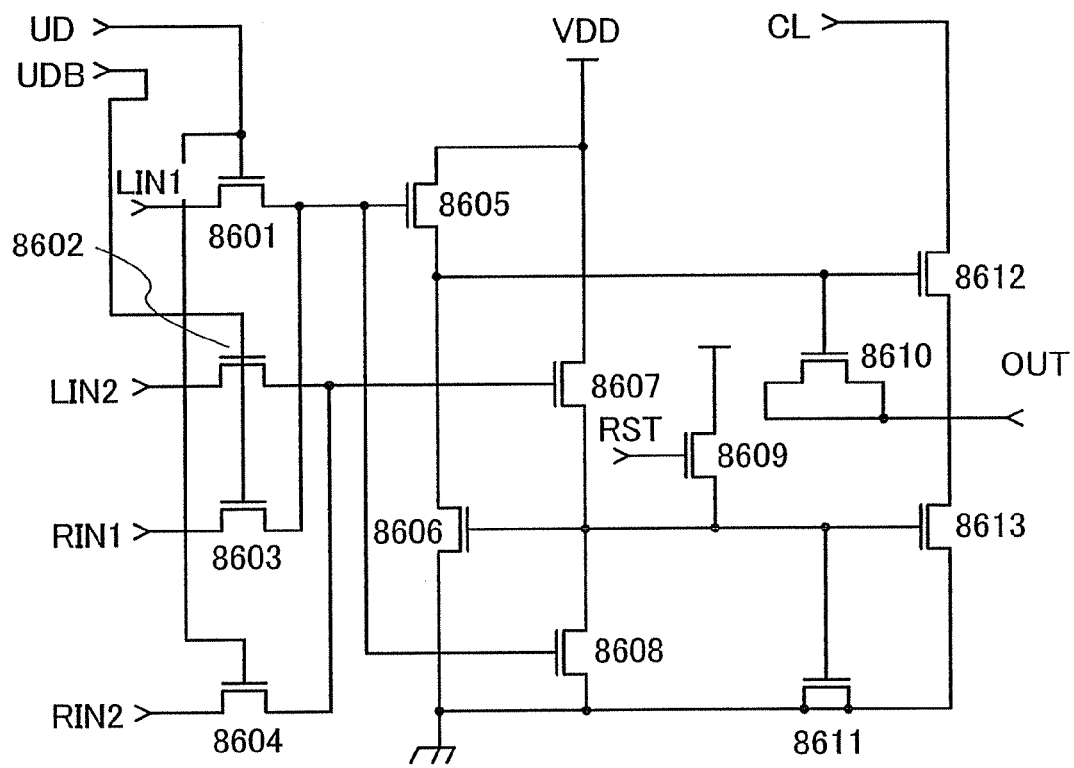
FIG. 20 is a diagram illustrating a circuit (a shift register circuit) configuration for a case where a scanning line driver circuit is formed using a TFT in a display panel of the present invention.

FIG. 20 shows a specific configuration of the pulse output circuit 8500, where the circuit includes n-channel TFTs 8601 to 8613. In this case, the sizes of the TFTs may be determined in consideration of operation characteristics of the n-channel TFTs using an SAS. For example, when the channel length is set to be 8 µm, the channel width can be set to be in the range of 10 to 80 µm.

Figure 21:
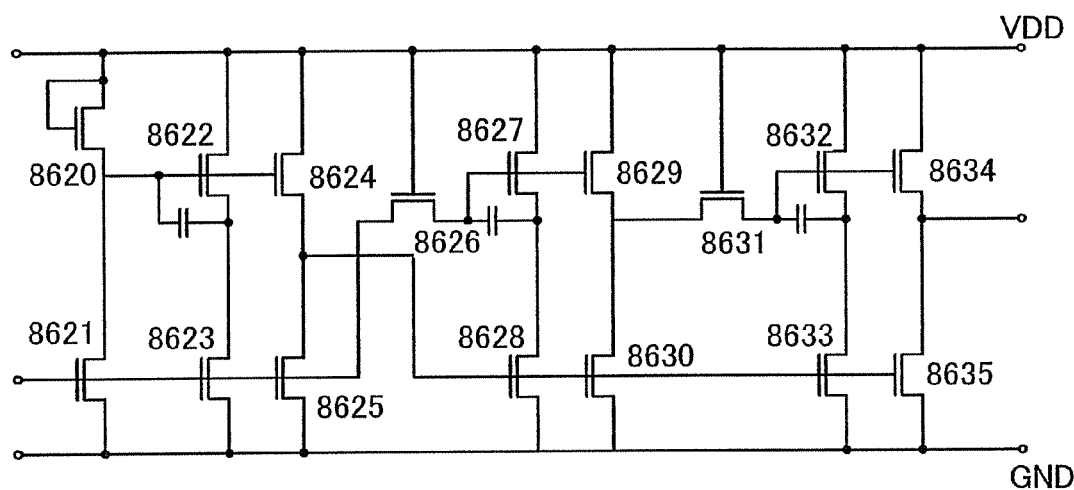
FIG. 21 is a diagram illustrating a circuit (a buffer circuit) configuration for a case where a scanning line driver circuit is formed using a TFT in a display panel of the present invention.

Further, a specific configuration of the buffer circuit 8501 is shown in FIG. 21. Similarly, the buffer circuit includes n-channel TFTs 8620 to 8635. In this case, the sizes of the TFTs may be determined in consideration of operation characteristics of the n-channel TFTs using an SAS. For example, when the channel length is set to be 10 µm, the channel width can be set to be in the range of 10 to 1800 µm.

In order to realize such a circuit, TFTs are necessary to be connected to one another with a wiring.

As described above, a driver circuit can be incorporated into a display panel.

Figure 22:
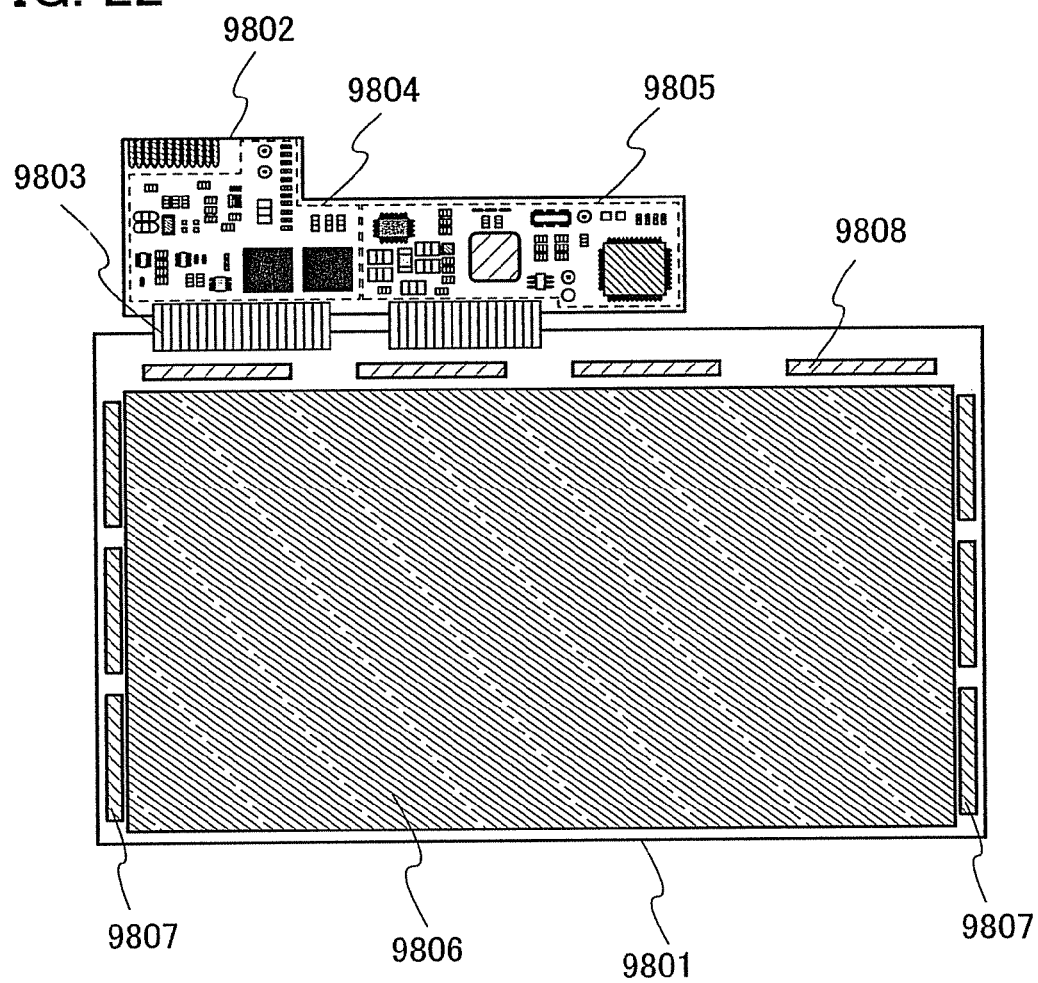
FIG. 22 is a top view illustrating a semiconductor device of the present invention.

A module having the display panel shown in a previous embodiment is described with reference to FIG. 22. FIG. 22 shows a module in which a display panel 9801 and a circuit substrate 9802 are combined. On the circuit substrate 9802, for example, a control circuit 9804, a signal dividing circuit 9805, and the like are formed. The display panel 9801 and the circuit substrate 9802 are connected to each other by a connection wiring 9803. A liquid crystal display panel, a light-emitting display panel, or an electrophoretic display panel, such as those shown in Embodiments 1 to 3, or the like can be used for the display panel 9801.

The display panel 9801 has a pixel portion 9806 where a light-emitting element is provided in each pixel, a scanning line driver circuit 9807, and a signal line driver circuit 9808 that supplies a video signal to a selected pixel. The pixel portion 9806 has a structure similar to that shown in Embodiments 1 to 3. The scanning line driver circuit 9807 and the signal line driver circuit 9808, each of which is formed using IC chips, are mounted on the substrate by a mounting method such as a method using an anisotropic conductive adhesive or an anisotropic conductive film, a COG method, wire bonding, a reflow treatment using a solder bump, or the like.

It is to be noted that part of the signal line driver circuit 9808, for example, an analog switch, may be formed over a substrate, and meanwhile the other part thereof may be mounted on the substrate by using an IC chip.

This embodiment enables modules having display panels to be provided with a high yield.

Embodiment 5

As examples of electronic appliances having a semiconductor device shown in any of the above-described embodiment modes and embodiments, a television device (also simply called a TV or a television receiver), a digital camera, a digital video camera, a mobile phone device (also simply called a mobile phone appliance or a mobile phone), a mobile information terminal such as a PDA, a mobile game machine, a monitor for a computer, a computer, a sound reproducing device such as a car audio device, an image reproducing device provided with a recording medium, such as a home-use game machine, and the like can be given. Specific examples of these are described with reference to FIGS. 23A to 23F.

Figure 23A:
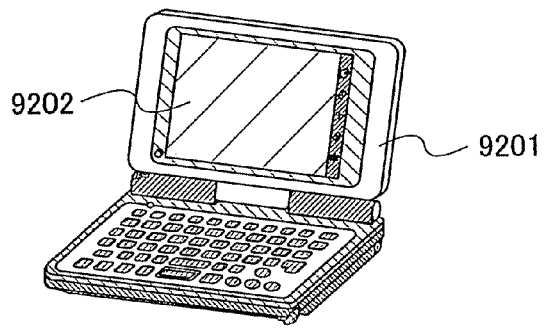
FIGS. 23A to 23F are views illustrating electronic devices which use a semiconductor device of the present invention.

A mobile information terminal shown in FIG. 23A includes a main body 9201, a display portion 9202, and the like. By applying the embodiment to the display portion 9202, a mobile information terminal can be provided at low price.

Figure 23B:
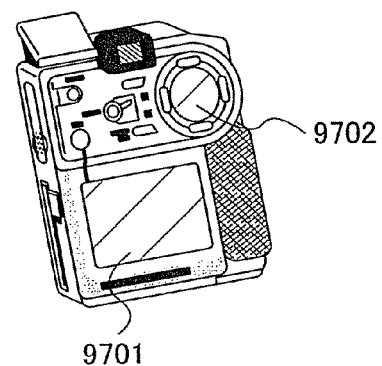

A digital video camera shown in FIG. 23B includes a display portion 9701, a display portion 9702, and the like. By applying the embodiment to the display portion 9701, a digital video camera can be provided at low price.

Figure 23C:
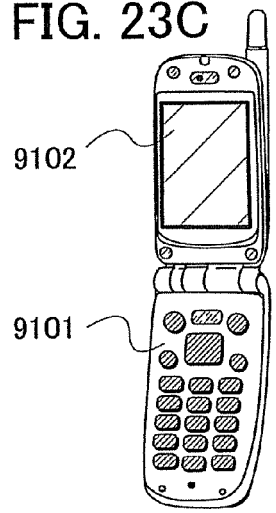

A mobile terminal shown in FIG. 23C includes a main body 9101, a display portion 9102, and the like. By applying the embodiment to the display portion 9102, a mobile terminal can be provided at low price.

Figure 23D:
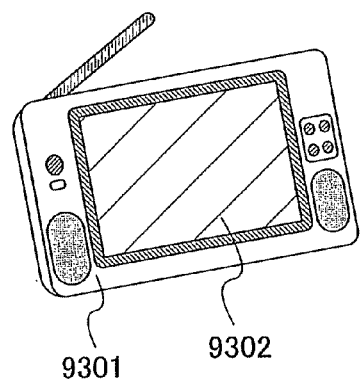

A mobile television device shown in FIG. 23D includes a main body 9301, a display portion 9302, and the like. By applying the embodiment to the display portion 9302, a mobile television device can be provided at low price. Such a television device can be widely applied to a small-sized device to be mounted to a mobile terminal such as a mobile phone, a middle-sized device that is portable, and a large-sized device (for example, 40 inches or more).

Figure 23E:
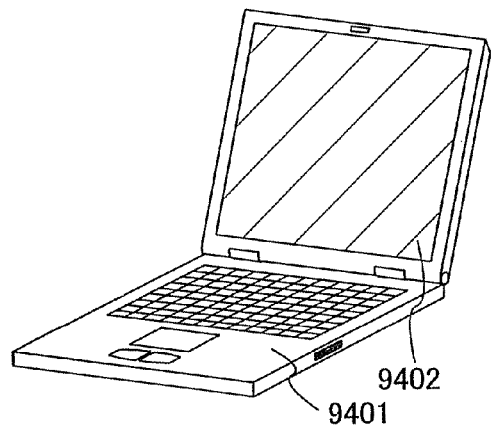

The mobile computer shown in FIG. 23E includes a main body 9401, a display portion 9402, and the like. By applying the embodiment to the display portion 9402, a mobile computer can be provided at low price.

Figure 23F:
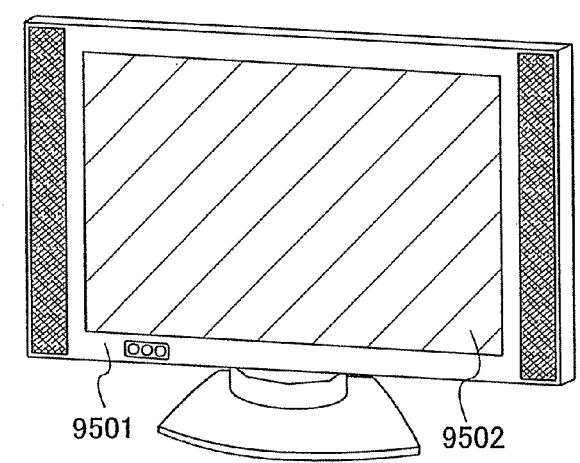

The television device shown in FIG. 23F includes a main body 9501, a display portion 9502, and the like. By applying the embodiment to the display portion 9502, a television device can be provided at low price.

Here, a structure of the television device is described with reference to FIG. 24.

Figure 24:
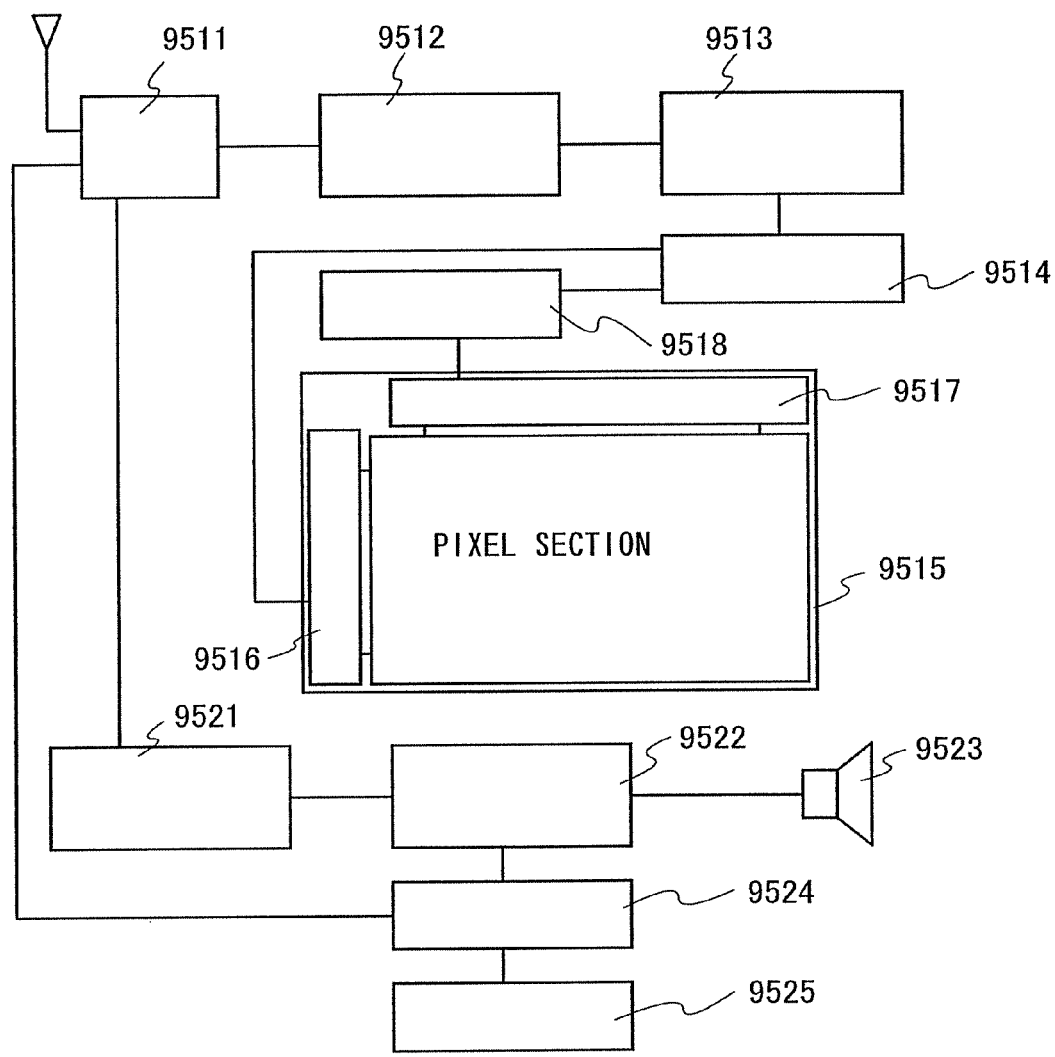
FIG. 24 is a diagram illustrating an electronic device which uses a semiconductor device of the present invention.

FIG. 24 is a block diagram showing the main structure of the television device. A tuner 9511 receives a video signal and an audio signal. The video signal is processed through a video detecting circuit 9512, a video signal processing circuit 9513 which converts the signal output from the video detecting circuit 9512 into a color signal corresponding to each color of red, green, or blue, and a control circuit 9514 which converts the video signal in accordance with input specification of a driver IC. The control circuit 9514 outputs signals to a scanning line driver circuit 9516 and a signal line driver circuit 9517 of a display panel 9515. In a case of digital driving, a signal dividing circuit 9518 may be provided on a signal line side so that the inputted digital signal is divided into m number of signals to be supplied.

Among the signals received by the tuner 9511, the audio signal is sent to an audio detecting circuit 9521 and its output is supplied to a speaker 9523 through an audio signal processing circuit 9522. The control circuit 9524 receives information which controls a receiving station (receiving frequency) and sound volume, and sends signals to the tuner 9511 and the audio signal processing circuit 9522.

The television device includes the display panel 9515; therefore, the television device can have low power consumption, and further, a television device capable of high-definition display can be manufactured.

The present invention is not limited to the television receiver and is applicable to a display medium particularly with a large area such as an information display board at a railway station, an airport, or the like, or an advertisement display board on the street as well as a monitor of a personal computer.

This application is based on Japanese Patent Application serial No. 2006-233232 filed in Japan Patent Office on Aug. 30, 2006, the entire contents of which are hereby incorporated by reference.

What is claimed is:

1. A method for manufacturing a semiconductor device comprising:
    forming a first layer over a substrate;
    forming a plurality of light absorbing layers over the first layer;
    forming a layer having a light-transmitting property over the first layer and the plurality of light absorbing layers; and
    irradiating the plurality of light absorbing layers with a linear laser beam so that the plurality of light absorbing layers are sublimated to be scattered by an energy of the linear laser beam and so that a part of the layer having a light-transmitting property overlapping with the plurality of light absorbing layers is removed,
    wherein an opening portion exposing the first layer is formed in the part of the layer having a light-transmitting property, and
    wherein the first layer is a semiconductor layer or a conductive layer.

2. A method for manufacturing a semiconductor device according to claim 1, wherein a second layer in contact with the first layer is formed after the first layer is exposed.

3. The method for manufacturing a semiconductor device according to claim 1, wherein the layer having a light-transmitting property is an insulating layer.

4. A method for manufacturing a semiconductor device comprising:
    forming a first layer over a substrate;
    forming a plurality of light absorbing layers over the first layer;
    forming a second conductive layer having a light-transmitting property over the first layer;
    forming a third layer having a light-transmitting property over the plurality of light absorbing layers and the second conductive layer having a light-transmitting property; and
    irradiating the plurality of light absorbing layers and the second conductive layer having a light-transmitting property with a linear laser beam so that the plurality of light absorbing layers are sublimated to be scattered by an energy of the linear laser beam and so that a part of the third layer having a light-transmitting property overlapping with the plurality of light absorbing layers is removed,
    wherein an opening portion exposing the first layer is formed in the part of the third layer having a light-transmitting property, and
    wherein the first layer is a semiconductor layer or a conductive layer.

5. A method for manufacturing a semiconductor device according to claim 4, wherein a second layer in contact with the first layer is formed after the first layer is exposed.

6. A method for manufacturing a semiconductor device according to claim 4, wherein the third layer having a light-transmitting property is an insulating layer.

7. A method for manufacturing a semiconductor device comprising:
    forming a first layer over a substrate;
    forming a plurality of light absorbing layers over the first layer;
    forming a second conductive layer having a light-transmitting property which extends in a first direction over the first layer;
    forming a third layer having a light-transmitting property over the plurality of light absorbing layers and the second conductive layer having a light-transmitting property; and
    irradiating a region, in which the plurality of light absorbing layers is formed, with a linear laser beam in a direction intersecting with the first direction so that the plurality of light absorbing layers are sublimated to be scattered by an energy of the linear laser beam and so that a part of the third layer having a light-transmitting property overlapping with the plurality of light absorbing layers is removed,
    wherein an opening portion exposing the first layer is formed in the part of the third layer having a light-transmitting property, and
    wherein the first layer is a semiconductor layer or a conductive layer.

8. A method for manufacturing a semiconductor device according to claim 7, wherein a second layer in contact with the first layer is formed after the first layer is exposed.

9. A method for manufacturing a semiconductor device according to claim 7, wherein the third layer having a light-transmitting property is an insulating layer.

* * * * *